United States Patent
Tang et al.

(10) Patent No.: US 11,860,815 B2
(45) Date of Patent: Jan. 2, 2024

(54) HIGH-DATA THROUGHPUT RECONFIGURABLE COMPUTING PLATFORM

(71) Applicant: Brookhaven Science Associates, LLC, Upton, NY (US)

(72) Inventors: Shaochun Tang, New York, NY (US); Michael Begel, New York, NY (US); Hucheng Chen, New York, NY (US); Helio Takai, New York, NY (US); Francesco Lanni, Segny (FR)

(73) Assignee: Brookhaven Science Associates, LLC, Upton, NY (US)

( * ) Notice: Subject to any disclaimer, the term of this patent is extended or adjusted under 35 U.S.C. 154(b) by 276 days.

(21) Appl. No.: 17/281,731

(22) PCT Filed: Oct. 4, 2019

(86) PCT No.: PCT/US2019/054896
§ 371 (c)(1),
(2) Date: Mar. 31, 2021

(87) PCT Pub. No.: WO2020/076658
PCT Pub. Date: Apr. 16, 2020

(65) Prior Publication Data
US 2021/0397580 A1     Dec. 23, 2021

Related U.S. Application Data

(60) Provisional application No. 62/741,083, filed on Oct. 4, 2018.

(51) Int. Cl.
*G06F 15/78* (2006.01)
*H05K 1/02* (2006.01)
(Continued)

(52) U.S. Cl.
CPC ............ *G06F 15/7867* (2013.01); *G06F 1/12* (2013.01); *G06F 1/189* (2013.01); *G06F 1/26* (2013.01);
(Continued)

(58) Field of Classification Search
CPC ........ G06F 15/7867; G06F 1/12; G06F 1/189; G06F 1/26; H05K 1/0251; H05K 2201/10121
See application file for complete search history.

(56) References Cited

U.S. PATENT DOCUMENTS

| 4,551,746 A | 11/1985 | Gilbert et al. |
| 5,343,074 A | 4/1994 | Higgins, III et al. |

(Continued)

FOREIGN PATENT DOCUMENTS

WO     2005/055432 A1     6/2005

OTHER PUBLICATIONS

Tang, S., et al., "the implementation of global feature extractor (gFEX)—the Atlas Calorimeter Level 1 Trigger system for LHC Run-3 upgrade", Brookhaven National Laboratory BNL-209045-2018-JAAM, Journal of Instumentation, Jul. 2018, pp. 1-13. (Year: 2018).*

(Continued)

*Primary Examiner* — Stacy Whitmore
(74) *Attorney, Agent, or Firm* — Dorene Price

(57) ABSTRACT

A reconfigurable computing platform includes a reconfigurable computing device, electro-optical transceiver, and first voltage converter disposed on a multilayer board. The electro-optical transceiver converts an optical signal at least one of to and from an electrical signal, and the electrical signal is operatively coupled to the reconfigurable computing device. The electro-optical transceiver is disposed in proximity to the reconfigurable computing device, and the (Continued)

first voltage converter is operatively coupled to a common voltage distributed around a periphery of the multilayer board. The first voltage converter converts the common voltage to a first operating voltage, and the first voltage converter is disposed in proximity to the reconfigurable computing device. The first operating voltage is provided to the reconfigurable computing device as a first power source. A reconfigurable computing system includes a plurality of reconfigurable computing platforms operatively coupled together using an optical signal. A corresponding method of providing a reconfigurable computing platform is also disclosed.

20 Claims, 24 Drawing Sheets

(51) Int. Cl.
    *G06F 1/12* (2006.01)
    *G06F 1/18* (2006.01)
    *G06F 1/26* (2006.01)

(52) U.S. Cl.
    CPC . *H05K 1/0251* (2013.01); *H05K 2201/10121* (2013.01)

(56) References Cited

U.S. PATENT DOCUMENTS

| | | | |
|---|---|---|---|
| 5,363,280 | A | 11/1994 | Chobot et al. |
| 5,404,338 | A | 4/1995 | Murai et al. |
| 5,691,955 | A | 11/1997 | Yamauchi |
| 5,956,203 | A | 9/1999 | Schirle et al. |
| 6,198,362 | B1 * | 3/2001 | Harada ............... H05K 1/0231 333/22 R |
| 6,373,913 | B1 | 4/2002 | Lee |
| 6,962,867 | B2 | 11/2005 | Jackson et al. |
| 7,196,415 | B2 | 3/2007 | Zhong et al. |
| 7,498,835 | B1 | 3/2009 | Rahman et al. |
| 7,856,838 | B2 | 12/2010 | Hillis et al. |
| 8,461,869 | B1 | 6/2013 | Rahim et al. |
| 2005/0177755 | A1 | 8/2005 | Fung |
| 2012/0069514 | A1 | 3/2012 | Ross |

OTHER PUBLICATIONS

International Search Report and Written opinion received for PCT Patent Application Serial No. PCT/US2019/054896 dated May 6, 2020, 10 pages.
Tang et al., "The implementation of Global Feature EXtractor (gFEX)—the Atlas Calorimeter Level 1 Trigger system for LHC Run-3 upgrade", In : Journal of Instrumentation, vol. 13, Jul. 16, 2018, 12 pages.
Tang et al., "gFEX, the Atlas Calorimeter Level-1 Real Time Processor", Nov. 20, 2015, 5 pages.
Wu et al., "The development of the Global Feature Extractor for the LHC Run-3 upgrade of the L1 Calorimeter trigger system", Jun. 20, 2016, 3 pages.
Chen et al., "The Prototype Design of gFEX—A Component of the L1Calo Trigger for the ATLAS Phase-I Upgrade", Dec. 23, 2016, 5 pages.
Tang et al., "The development of the Global Feature extractor (gFEX)—the Atlas Calorimeter Level 1 Trigger for Atlas at High Luminosity LHC", Oct. 17, 2017, 3 pages.
Atlas Collaboration, Search for new phenomena in final states with large jet multiplicities and missing transverse momentum using sqrt(s)=7 TeV pp collisions with the Atlas detector, JHEP 11 (2011) 099, arXiv: 1110.2299 [hep-ex], 20 pages.
ATLAS Collaboration, Pile-up subtraction and suppression for jets in ATLAS, ATLAS-CONF-2013-083, Aug. 9, 2013, 42 pages.
J. Bracinik et al., Atlas Level-1 Calorimeter Trigger Firmware Upgrade of Cluster Processor Module Project Specification, Aug. 1, 2014 V1.0.13. http://epweb2.ph.bham.ac.uk/user/bracinik/CPMPhase0/CPMPh0Spec.pdf, 35 pages.
L1Calo CMX Collaboration, Atlas Level-1 Calorimeter Trigger CMX Module Project Specification, Aug. 8, 2011 V1.0. http://www.pa.msu.edu/hep/atlas/l1calo/cmx/specification/1_preliminary_design_review/CMX_Project_Specification_v1.0_final.pdf, 25 pages.
J. Schafer et al., Atlas Level-1 Calorimeter Trigger Jet/Energy Processor Module Project Specification. Nov. 21, 2006 v1.2d. http://hepwww.rl.ac.uk/Atlas-L1/Modules/JEM/JEMspec12d.pdf, 9 pages.
W. Marcel et al., Development of the jet Feature EXtractor (jFEX) for the Atlas Level 1 calorimeter trigger upgrade at the LHC. Oct. 15, 2017; DOI: 10.22323/1.313.0133, 5 pages.
ATLAS Collaboration, Performance of shower deconstruction in ATLAS, ATLAS-CONF-2014-003. Feb. 7, 2014; https://atlas.web.cern.ch/Atlas/GROUPS/PHYSICS/CONFNOTES/ATLAS-CONF-2014-003, 14 pages.
Atlas Collaboration, Global Feature Extraction (gFEX) Performance Plots, ATL-COM-DAQ-2014-087. Apr. 11, 2015; https://twiki.cern.ch/twiki/bin/view/AtlasPublic/JetTriggerPublicResults#Global_Feature_Extraction_gFEX_P, 14 pages.
CERN-LHCC-2012-022. LHCC-I-023. AdvancedTCA® Specification. http://www.picmg.org/openstandards/advancedtca, Dec. 2012, 148 pages.
J. Anderson et al., FELIX: a High-Throughput Network Approach for Interfacing to Front End Electronics for Atlas Upgrades, J. Phys. Conf. Ser. 664, No. 8, 082050, 2015, 8 pages.

* cited by examiner

HIGH-DATA THROUGHPUT RECONFIGURABLE COMPUTING PLATFORM

CROSS-REFERENCE TO RELATED APPLICATIONS

This application is a National Phase Application of International Application No. PCTUS2019054896, filed Oct. 4, 2019, which claims the benefit of, and priority to, U.S. Provisional Application No. 62/741,083, filed Oct. 4, 2018, the disclosures of which are incorporated herein by reference in their entireties.

STATEMENT OF GOVERNMENT LICENSE RIGHTS

This invention was made with government support under contract number DE-SC0012704 awarded by the U.S. Department of Energy. The U.S. Government may have certain rights in the invention.

BACKGROUND

Field

The disclosed embodiments generally relate to a high-data throughput reconfigurable computing platform or global feature extractor used for analyzing unforeseen events, pattern recognition, and correlation analysis with respect to massive amounts of data in real time.

SUMMARY

The disclosed embodiments relate to a reconfigurable computing platform, which includes a reconfigurable computing device disposed on a multilayer board, an electro-optical transceiver disposed on the multilayer board, and a first voltage converter disposed on the multilayer board. The electro-optical transceiver converts an optical signal at least one of to and from an electrical signal, and the electrical signal is operatively coupled to the reconfigurable computing device. The electro-optical transceiver is disposed in proximity to the reconfigurable computing device, and the first voltage converter is operatively coupled to a common voltage distributed around a periphery of the multilayer board. The first voltage converter converts the common voltage to a first operating voltage, and the first voltage converter is disposed in proximity to the reconfigurable computing device. The first operating voltage is provided to the reconfigurable computing device as a first power source.

The first voltage converter may include a first voltage regulator that regulates the first operating voltage, and the first voltage converter may be disposed less than approximately 4 inches from the reconfigurable computing device. The reconfigurable computing platform may include a second voltage converter operatively coupled to the common voltage, and the second voltage converter may convert the common voltage to a second operating voltage. The second voltage converter may be disposed in proximity to the electro-optical transceiver, and the second operating voltage may be provided to the electro-optical transceiver as a second power source. The second voltage converter may include a second voltage regulator that regulates the second operating voltage, and the second voltage converter may be disposed less than approximately 4 inches from the electro-optical transceiver.

The reconfigurable computing device may include a field programmable gate array, and the optical signal may at least one of originate and terminate external to the multilayer board. The electrical signal may originate and terminate on the multilayer board. The electro-optical transceiver may be disposed less than approximately 4 inches from the reconfigurable computing device. The electrical signal may be operatively coupled between the electro-optical transceiver and reconfigurable computing device using a first trace associated with the multilayer board, and the first trace may have a length of less than approximately 3 inches. The at least one of the reconfigurable computing device and electro-optical transceiver may be disposed on the multilayer board based on an above-board height associated with the at least one of the reconfigurable computing device and electro-optical transceiver such that an air flow channel is disposed above the at least one of the reconfigurable computing device and electro-optical transceiver in response to air flowing over the multilayer board, and the above-board height may define a distance from a top surface of the multilayer board to a top surface of the at least one of the reconfigurable computing device and electro-optical transceiver.

The reconfigurable computing platform may include a decoupling capacitor disposed on a rear side of the multilayer board, and the decoupling capacitor may be electrically coupled to at least one of the reconfigurable computing device and electro-optical transceiver using a via. The at least one of the reconfigurable computing device and electro-optical transceiver may be disposed on a front side of the printed circuit board, the rear side opposes the front side, and a back-drilling technique may be applied to the via. The via may be electrically coupled to the decoupling capacitor and the at least one of the reconfigurable computing device and electro-optical transceiver by a second trace, the second trace may include an impedance, and the impedance may be maintained using the back-drilling technique. The reconfigurable computing device may operate synchronously with respect to a clock signal, and the reconfigurable computing device may recover the clock signal based on the optical signal, thereby enabling synchronization of the reconfigurable computing device to an electrical component disposed externally to the multilayer board.

The disclosed embodiments further relate to a reconfigurable computing system, which includes a plurality of reconfigurable computing platforms operatively coupled together using an optical signal. At least one of the plurality of reconfigurable computing platforms includes a reconfigurable computing device disposed on a multilayer board, an electro-optical transceiver disposed on the multilayer board, and a first voltage converter disposed on the multilayer board. The electro-optical transceiver converts the optical signal to and from an electrical signal, the electrical signal is operatively coupled to the reconfigurable computing device, and the electro-optical transceiver is disposed in proximity to the reconfigurable computing device. The first voltage converter is operatively coupled to a common voltage distributed around a periphery of the multilayer board, the first voltage converter converts the common voltage to a first operating voltage, the first voltage converter is disposed in proximity to the reconfigurable computing device, and the first operating voltage is provided to the reconfigurable computing device as a first power source.

The first voltage converter may include a first voltage regulator that regulates the first operating voltage, and the first voltage converter may be disposed less than approximately 4 inches from the reconfigurable computing device.

The reconfigurable computing system may include a second voltage converter operatively coupled to the common voltage, the second voltage may convert the common voltage to a second operating voltage, the second voltage converter may be disposed in proximity to the electro-optical transceiver, and the second operating voltage may be provided to the electro-optical transceiver as a second power source. The second voltage converter may include a second voltage regulator, the second voltage regulator may regulate the second operating voltage, and the second voltage converter may be disposed less than approximately 4 inches from the electro-optical transceiver.

The disclosed embodiments yet further relate to a method of providing a reconfigurable computing platform, which includes disposing a reconfigurable computing device on a multilayer board, disposing an electro-optical transceiver in proximity to the reconfigurable computing device on the multilayer board, and disposing a first voltage converter in proximity to the reconfigurable computing device on the multilayer board. The electro-optical transceiver converts an optical signal to and from an electrical signal, and the electrical signal is operatively coupled to the reconfigurable computing device. The first voltage converter is operatively coupled to a common voltage distributed around a periphery of the multilayer board, the first voltage converter converts the common voltage to a first operating voltage, and the first operating voltage is provided to the reconfigurable computing device as a first power source.

The first voltage converter may include a first voltage regulator that regulates the first operating voltage, and the method may include disposing the first voltage converter less than approximately 4 inches from the reconfigurable computing device.

Other embodiments will become apparent from the following detailed description considered in conjunction with the accompanying drawings. It is to be understood, however, that the drawings are designed as an illustration only and not as a definition of the limits of any of the embodiments.

BRIEF DESCRIPTION OF THE DRAWINGS

The following drawings are provided by way of example only and without limitation, wherein like reference numerals (when used) indicate corresponding elements throughout the several views, and wherein.

It is to be appreciated that elements in the figures are illustrated for simplicity and clarity. Common but well-understood elements that are useful or necessary in a commercially feasible embodiment are not shown in order to facilitate a less hindered view of the illustrated embodiments.

DETAILED DESCRIPTION

Figure 1A:
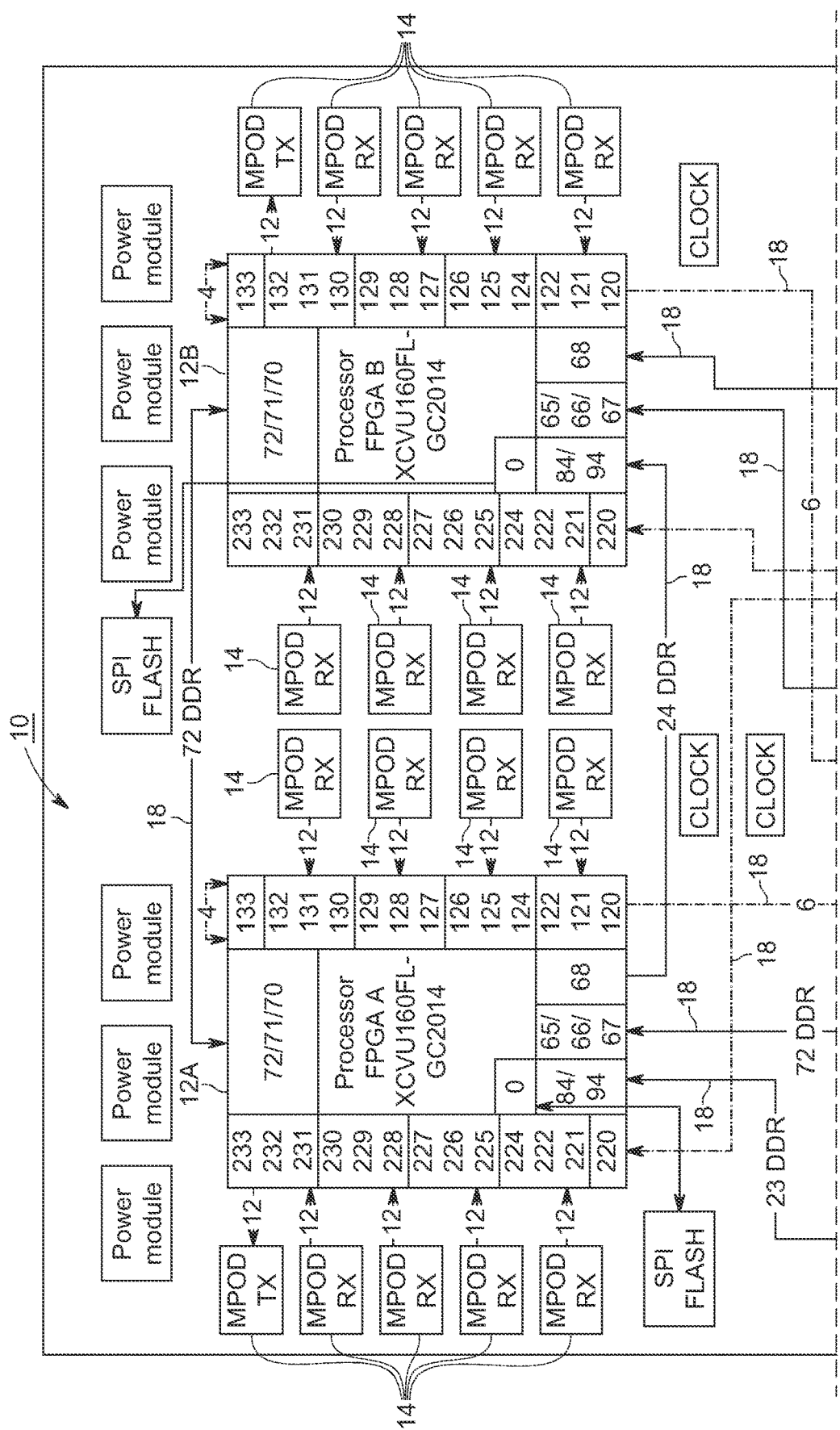
FIGS. 1A and 1B show a layout diagram of an illustrative embodiment of a reconfigurable computing platform or global feature extractor (gFEX) in accordance with the present disclosure.
Figure 1B:
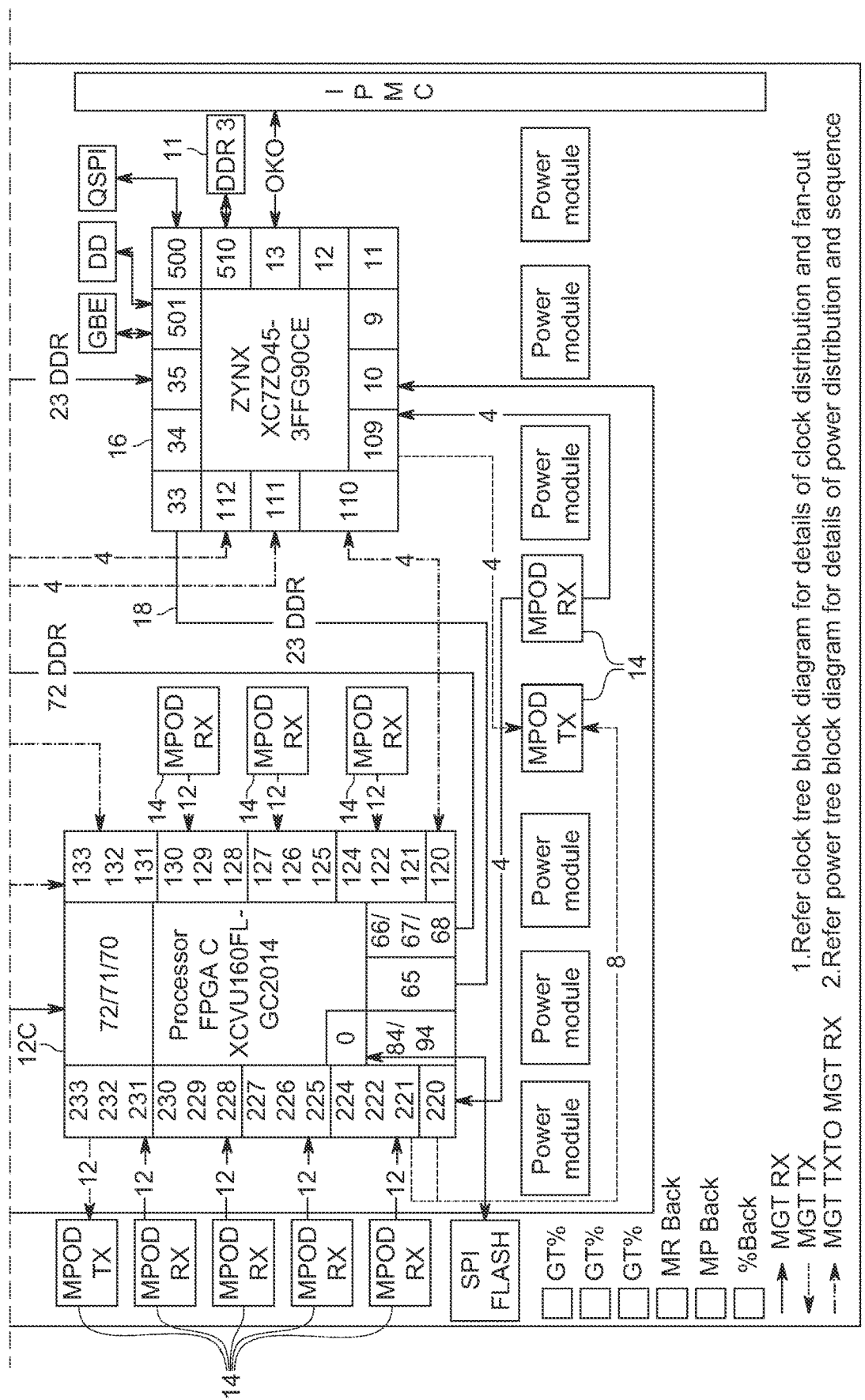
Figure 2A:
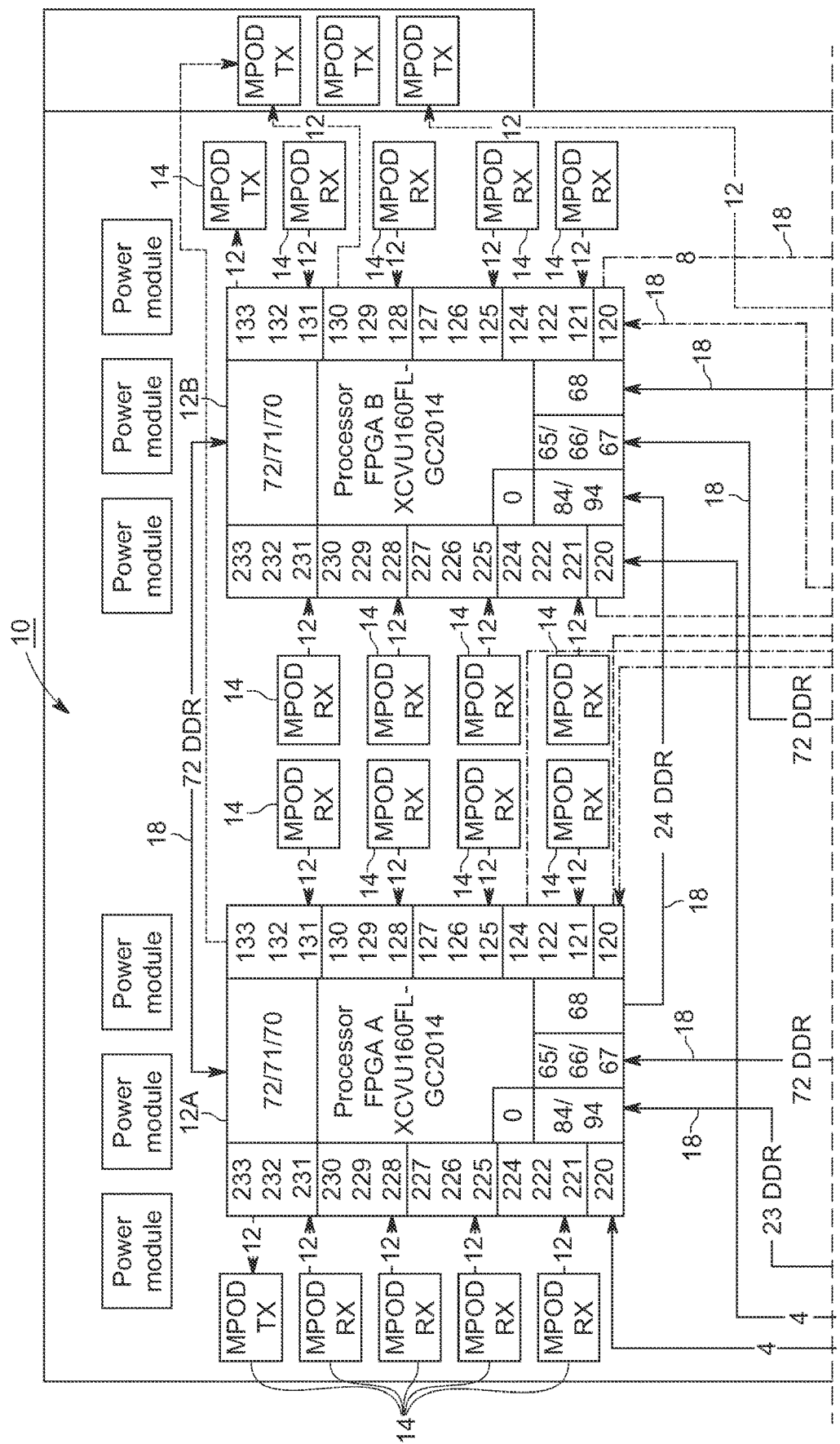
FIGS. 2A and 2B show a layout diagram of another illustrative embodiment of the reconfigurable computing platform in accordance with the present disclosure.
Figure 2B:
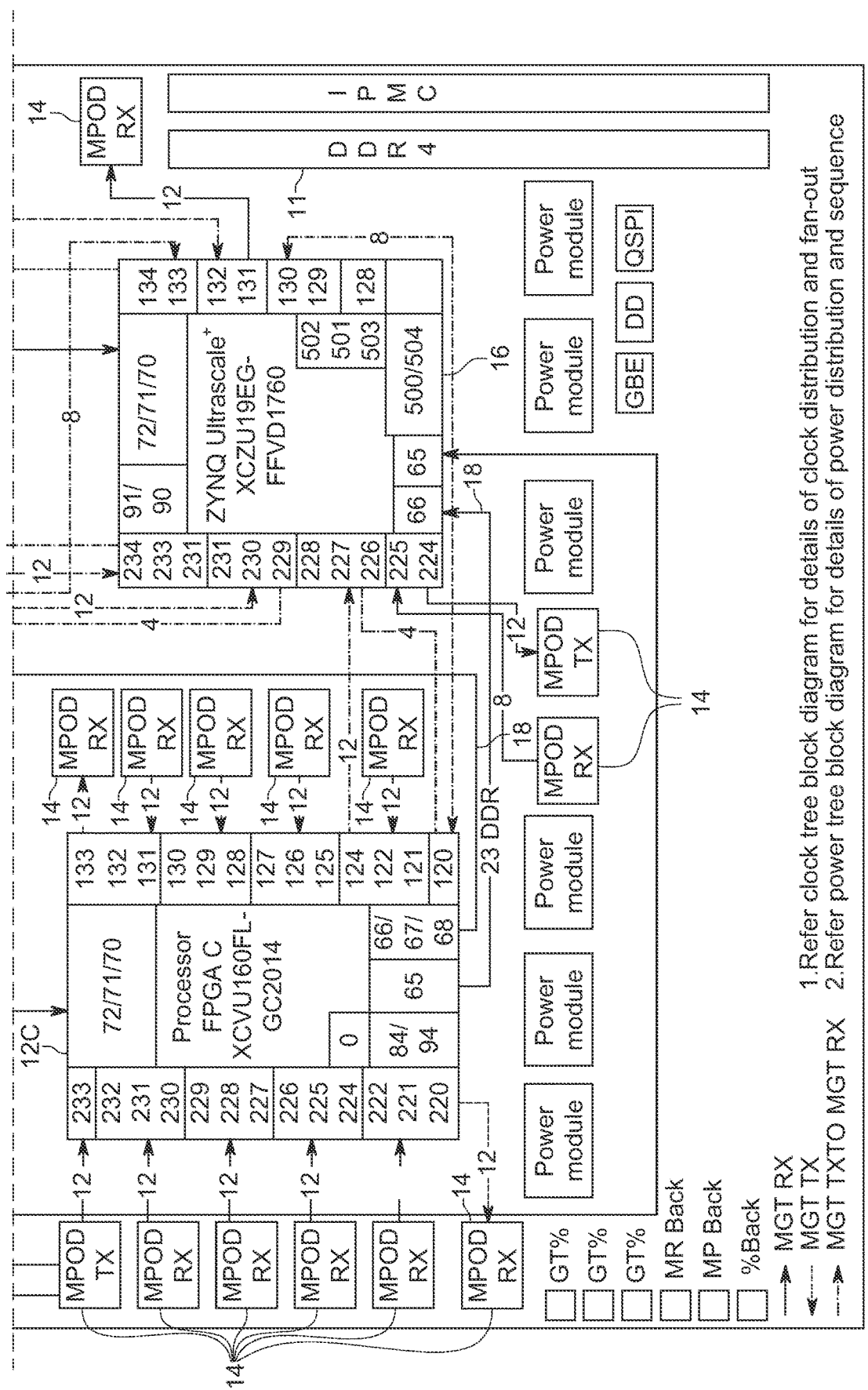

A layout diagram of an embodiment 10 of the reconfigurable computing platform is shown in FIG. 1. The reconfigurable computing platform includes three processing reconfigurable computing devices or FPGAs 12A-C surrounded by MiniPODs 14 that convert optical signals to electrical signals. The MiniPods 14 are located adjacent to the FPGAs 12A-C to minimize the need for long traces. A reconfigurable computing device or system-on-chip (SoC) 16 is positioned in the lower right corner of the board. The components are interconnected via high-speed buses 18. The three large FPGAs 12A-C and the SoC 16 are interfaced to optical fibers using the MiniPods 14. The FPGAs 12A-C and the SoC 16 are interconnected using high-speed internal links 18. A layout diagram of another embodiment 20 of the reconfigurable computing platform, which incorporates additional MiniPODs 14 and memory (DDR4 DIMM 11), is shown in FIG. 2.

The development of the high-data throughput reconfigurable computing platform 10, 20 or global feature extractor (gFEX) was motivated by the need of the ATLAS (a toroidal large hadron collider apparatus) detector and experiment at CERN (the European Organization for Nuclear Research) in Switzerland to perform pattern recognition of data from a calorimeter system in five large hadron collider (LHC) clock cycles or 125 ns. The ATLAS experiment requires multiple algorithms to be run in parallel to evaluate if there is an event that may be interesting for further analysis. These requirements led to the development of the high-data throughput, high-performance reconfigurable computing platform. Features of the reconfigurable computing platform include a combination of high-performance reconfigurable computing aligned with high-data throughput for data input and output. Thus, the reconfigurable computing platform provides an elegant and highly powerful solution for use in in-vehicle processing and autonomous systems; aircraft; industrial machinery, medical devices and monitoring; test and simulation; pattern recognition and correlation analysis, including energy grid monitoring and homeland security; cryptography, including data encryption and decryption; artificial intelligence, including neural networks, natural language processing, and deep learning.

The detector generates large amounts of raw data, which includes about 25 megabytes per event multiplied by 40 million beam crossings per second in the center of the detector. This produces a total of 1 petabyte of raw data per second. A trigger system uses information to identify, in real time, the most interesting events to retain for detailed analysis. There are three trigger levels. The first is based in electronics on the detector, while the remaining two operate primarily on a large computer cluster near the detector. The first-level trigger selects about 100,000 events per second. After the third-level trigger has been applied, a few hundred events remain to be stored for further analysis. This amount of data requires over 100 megabytes of disk space per second, which is at least a petabyte per year.

Earlier particle detector read-out and event detection systems were based on parallel shared buses, such as VMEbus or FASTBUS. However, these bus architectures cannot satisfy the data requirements of the experiments. Offline event reconstruction is performed on all permanently stored events, turning the pattern of signals from the detector into physical objects, such as jets, photons, and leptons.

A market survey was conducted prior to the start of development, which did not uncover any conventional platforms that could match the performance of the high-data throughput reconfigurable computing platform 10, 20. The reconfigurable computing platform is designed to find unforeseen events in massive amounts of data in real time.

The reconfigurable computing platform 10, 20 uses the flexibility of FPGAs 12A-12C to achieve high performance computing. Reconfigurable computers are distinguishable from traditional computing platforms for their ability to route data and control flow during processing. The name reconfigurable computing stems from the ability to adapt a hardware configuration during processing by loading new tasks on a programmable fabric. The reconfigurable computer is primarily used for parallel computing, in which many tasks are processed concurrently for the same data set. The reconfigurable computer is highly effective in pattern recognition, artificial intelligence, neural networks, cryptography, signal processing, video processing, and in general parallel computing.

The reconfigurable computing platform 10, 20 was developed to serve as a fast, real-time computing platform to select events of interest for each collision. The reconfigurable computing platform 10, 20 receives low-resolution data from calorimeters on approximately 300 optical fibers at a rate of 300 Tera bits per second (Tb/s) and outputs the results of calculations on approximately 100 optical fibers at a rate of 100 Tera bits per second. The total processing time allotted is 125 ns per collision, which occurs at 40 MHz. During this time, the reconfigurable computing platform 10, 20 concurrently executes at least five different algorithms. To achieve this performance, the reconfigurable computing platform 10, 20 is implemented using the three large FPGAs 12A-C, which are commercially available from Xilinx Corporation as the Ultra-Scale FPGA, and one system-on-chip (SoC) 16, which is also commercially available from Xilinx Corporation as the ZYNQ. The architecture of the reconfigurable computing platform 10, 20 is such that optical signals are converted to and from electrical signals as physically near as possible to the corresponding FPGA 12A-C, 16 to substantially eliminate signal distortion, reflection, and cross-talk in high-speed electrical signals. Accordingly, the distance between an electro-optical converter or transceiver (MiniPOD 14) and the corresponding FPGA 12A-C, to which that electro-optical converter is connected, is configured to be no longer than approximately 6 inches, and preferably less than approximately 4 inches. The optical signals are preferably transferred to and from the optical-electrical converters using PRIZM fiber, which is available from Moog Inc. The optical signals are routed to and from the electro-optical converters using one or more traces on one or more layers of the multilayer board. The electrical traces between the electro-optical converter and corresponding FPGA 12A-C, to which that electro-optical converter is connected, are maintained to be no longer than approximately 5 inches long, and preferably less than approximately 3 inches.

In addition, each of the FPGAs is interconnected via high-speed links. These features enable synchronous operation of the FPGA-based processors in the reconfigurable computing platform 10, 20. In addition, two or more reconfigurable computing platforms can be coupled together by using the input/output optical signals associated with the reconfigurable computing platforms to exchange data, address, and control information between boards in any configuration and/or topology including, but not limited to, a serial configuration, parallel configuration, star configuration, and/or master/slave configuration.

On a multiple FPGA board, clock synchronization is vital to processor operation. Data transfer and synchronization of data processing and output are controlled by a common system clock signal. On the reconfigurable computing platform 10, 20, the system clock signal is synchronized to an external clock signal that enables synchronous board-to-board operations. Thus, the reconfigurable computing platform can be synchronized with one or more external boards. The on-board SoC 16 is used to distribute the system clock signal to the processor FPGAs 12A-C, which enables synchronization and clock distribution flexibility that has not been utilized in conventional designs. To perform this synchronization, the on-board SoC 16 receives an optical signal from the external link and recovers the external clock signal from the optical signal. The external clock signal recovery is performed by analyzing a data pattern in the optical signal and adjusting a phase of the system clock in accordance with the data pattern to maintain the desired phase of the system clock, and thus synchronization. The recovered clock signal is then used as the common system clock signal for the remaining FPGAs 12A-C on the reconfigurable computing platform 10, 20.

The reconfigurable computing platform 10, 20 is implemented using an industry advanced telecommunications computing architecture (ATCA) format. The reconfigurable computing platform 10, 20 includes three UltraScale+ FPGAs 12A-C (which are commercially available from Xilinx Corporation as part no. FPGA XCVU9P-2FLGC2104E) and the ZYNQ Ultrascale+. SoC 16 (which is commercially available from Xilinx Corporation as part no. XCZU19EG-2FFVD1760E). The optical-to-electrical conversion is implemented using thirty-five (35) MiniPODs 14 (which are commercially available from Foxconn Interconnect Technology, Inc.). 312 input fibers at 12.8 Gb/s and 108 output fibers at 12.8 Gb/s are used to interface to incoming and outgoing signals. The Ultrascale+ FPGAs 12A-C include eight (8) 25.6 Gb/s links and twelve (12) 12.8 Gb/s links to the ZYNQ Ultrascale+ SoC 16. Parallel data buses link pairs of FPGAs 12A-C, 16 running at 1.12 Gb/s using a 560 MHz clock double data rate (DDR) mode. The ZYNQ Ultrascale+ 16 is used to control and configure the three Ultrascale+ FPGAs 12A-C, monitor board health and interface to the gigabit ethernet and universal asynchronous receiver transmitter (UART). A variety of sensors including, but not limited to, temperature sensors, voltage sensors, current sensors, air flow sensors, power sensors, and the like, are implemented using discrete components and/or the FPGAs 12A-C on the reconfigurable computing platform. These sensors are accessed by one or more of the FPGAs using an I2C bus, which then performs programmable operations in response to the measured value obtained from one or more of the sensors.

The reconfigurable computing platform 10, 20 also includes a 16 GB DDR 4•dual in-line memory module (DIMM) 11 attached to the ZYNQ Ultrascale+ that is used to buffer the processing data. Total power consumption of the reconfigurable computing platform 10, 20 with all FPGAs 12A-C, 16 running at 12.8 Gb/s is typically 300 W, which is substantially less than the 400 W limitation in the ATCA standard.

The board is implemented as a 30-layer printed circuit board, including twelve (12) signal layers, fourteen (14) ground layers, and four (4) power layers. The insulating material for the board is Megton-6. The routing of signals is carefully laid out to maximize signal integrity and reduce signal cross-talk. For the differential pairs, except those associated with DDR 4 DIMM 11 related signals, the impedance is controlled to 100 Ohms, and for the differential pairs associated with the DDR 4 DIMM related signals, the differential pairs are configured to 86 Ohms and 66 Ohms. The single-ended lines, except those associated with the DDR 4 DIMM, are configured to be 50 Ohms, and the single-ended lines associated with the DDR 4 DIMM are configured to be 39 Ohms. These impedances are used to accommodate design guidelines associated with various components, such as the DDR4 DIMM, used in the reconfigurable computing platform. The impedances are provided by executing computer-aided design simulations, which are, for example, executed on systems available from Cadence Corporation, of the board layout and wiring during fabrication of the board, and tested to ensure that the actual impedances following fabrication of the board meet the design guidelines.

For the parallel data buses, a length constraint and 5-W rule are applied in each data group (24 low-voltage differential signaling (LVDS) pairs) which make it possible to operate at 1.12 Gb/s. The 5-W rule minimizes crosstalk between high-speed parallel traces by requiring that the space separating the parallel traces be wider than five (5) times a height of either of the parallel traces when measured from the top of that trace to a reference plane, which is the plane on which that trace is disposed. For the 12.8 Gb/s and 25.6 Gb/s traces, a back-drill technology is used to minimize the stub and guarantee signal integrity.

The back-drilling technology is used to remove an unused portion, or stub, of copper barrel from a thru-hole in a printed circuit board. When a high-speed signal travels between printed circuit board (PCB) layers through a copper barrel, the high-speed signal becomes distorted. If the signal layer usage results in a stub being present, and the stub is long, then that distortion becomes significant. These stubs can be removed by re-drilling those holes after the fabrication is complete, with a slightly larger drill. The holes are back drilled to a controlled depth, close to, but not touching, the last layer used by the via.

Interconnection between FPGA lines requires the use of capacitors to decouple the DC voltage. On low-density boards, the capacitors are mounted between the FPGAs on the same side that the FPGAs are placed or disposed. For high-density boards, this is not possible given the lack of physical space. A method that allows positioning the capacitor on the rear side of a multilayer printed circuit board has been developed to alleviate this issue. The main difficulty in positioning the capacitor on the rear side of a multilayer printed circuit board is to preserve the line impedance for the high-speed signals while being routed through multiple layers. However, line impedance can be maintained by using the back-drilling technique to route signals vertically through the layers followed by horizontal traces in signal layers. This back-drilling technique is implemented on the reconfigurable computing platform 10, 20 to interconnect the processor FPGAs 12A-C, as well as connect the SoC 16 to the FPGAs 12A-C. The back-drilling technique is used to remove stubs created in through-board vias during fabrication of the board. These stubs, if left on the board, would add unwanted reflections to signals as the signals traversed the vias to the end of the stubs and back to the intended destination(s) and source(s) of the signals.

As shown in FIGS. 1 and 2, the optical-to-electrical converters 14 are positioned as close as possible to the corresponding FPGA(s), with which the optical-to-electrical converter is coupled, to minimize signal distortion.

The reconfigurable computing platform 10, 20 includes four (4) primary 1-ounce power planes that distribute a high-current electrical voltage to the FPGAs while minimizing voltage drop. Power is distributed to the FPGAs by first distributing a common higher voltage, such as 48 V, around the periphery of the printed circuit board followed by converting, and optionally regulating, this common higher voltage to one or more specific required voltage values, such as 0.95V, 1.0V, 1.2 V, 1.8 V, 2.5 V, 3.3 V, and/or 12V, as physically near as possible to, for example, less than approximately 4 inches from the intended destination of the required voltage value, such as an FPGA 12A-C 16 and/or other component with specific and/or substantial power requirements. This technique differs from conventional techniques utilizing single-point voltage generation that leads to substantial losses in power due to ohmic resistance in printed circuit lines. This technique also satisfies high-current and high-power distribution requirements without significant losses, which is well-suited for applications requiring multiple high-power processors on a single printed circuit board. Power planes are used for the power rails and are, for example, approximately 6"×6" in dimension with 1 oz. thickness copper when used to provide the 0.95V, 1.0V, and 1.2V power rails to the FPGAs 12A-C. The 48V power plane is connected to the 12V DC/DC converter or regulator. The 12V power provided by the 12V DC/DC converter or regulator is then coupled to the 12V power plane, which provides power to the remaining regulators.

In addition, a remote sense function, which is a key feature that was specifically selected for implementation in the reconfigurable computing platform, is used to compensate for the voltage drop caused by the high-power dissipation of the reconfigurable computing platform 10, 20.

The reconfigurable computing platform 10, 20 10 is one of several hardware modules designed to maintain a trigger acceptance rate with an increasing large hadron collider (LHC) luminosity and increasing pile-up conditions. The reconfigurable computing platform 10, 20 is used to identify patterns of energy associated with a hadronic decay of high momentum Higgs, W & Z bosons, top quarks, and exotic particles in real time at the 40 MHz LHC bunch crossing rate. The reconfigurable computing platform 10, 20 also receives coarse-granularity information, which is represented by $\Delta\eta \times \Delta\varphi = 0.2 \times 0.2$ gTower, from calorimeters on 276 optical fibers. The gTower is a unit of area associated with the detector, and $\Delta\eta$ and $\Delta\varphi$ represent orthogonal directions in a two-dimensional area.

The reconfigurable computing platform 10, 20 identifies large-radius jets, such as Lorentz-boosted objects using wide-area jet algorithms refined by additional information. The high-pT bosons and fermions are a key component. The trigger system is designed for narrow jets with limited acceptance for large objects. The acceptance for large-radius jets is substantially enhanced by the inclusion of the reconfigurable computing platform 10, 20. The architecture of the reconfigurable computing platform 10, 20 permits event-by-event local pileup suppression for large-R objects using baseline subtraction techniques.

Figure 3:
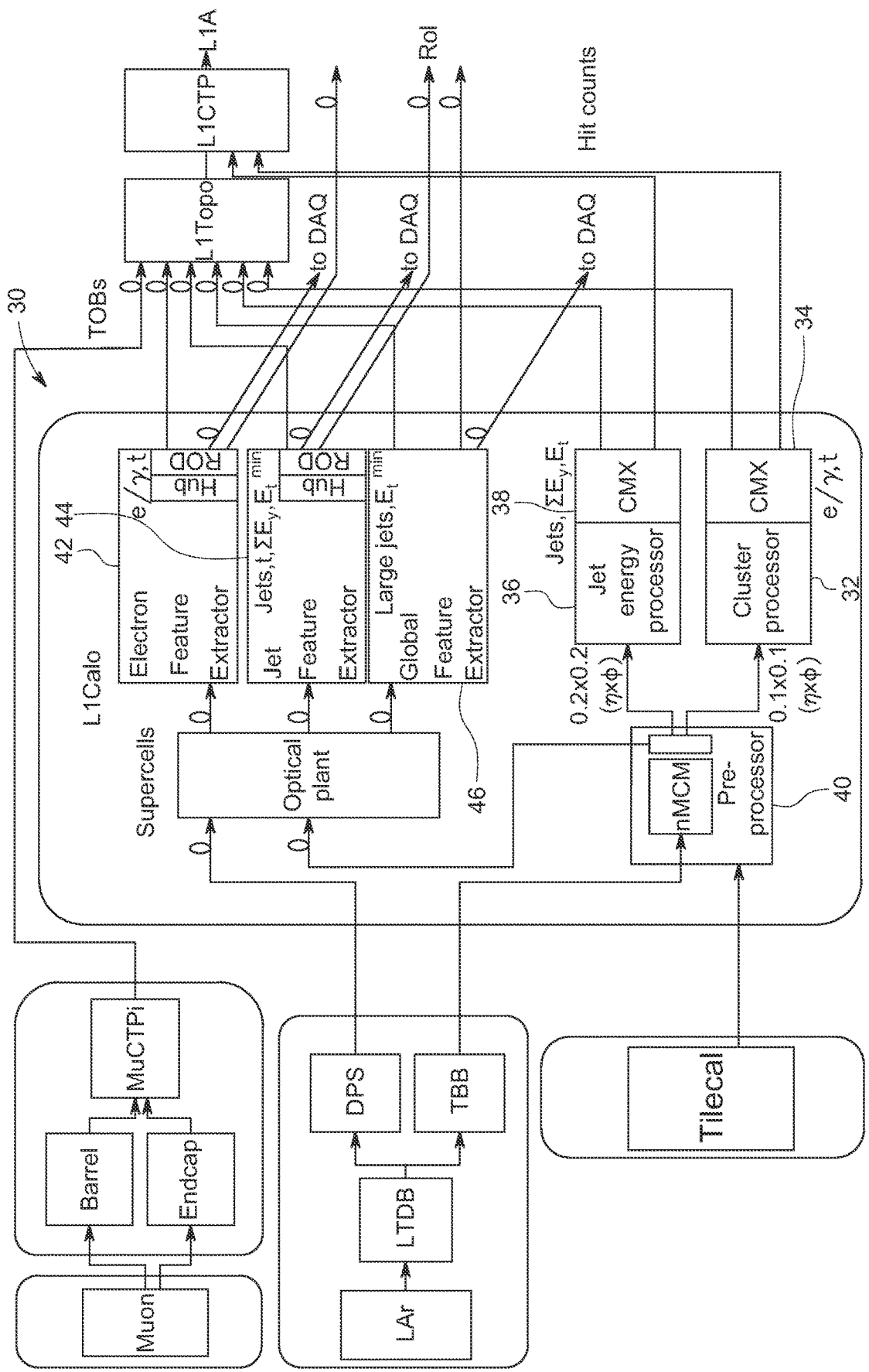
FIG. 3 shows a block diagram of a system in which the reconfigurable computing platform is implemented.

As shown in FIG. 3, a calorimeter system 30 includes three major subsystems: a cluster processor subsystem (CP) 32 that includes cluster processor modules (CPMs) and common merger extended modules (CMXs); a jet/energy processor subsystem (JEP) 36 that includes jet/energy modules (JEMs) and CMXs 38; and a pre-processor subsystem 40 with pre-processor modules (PPM). Three feature identification systems include an electron feature extractor (eFEX) 42, a jet feature extractor (jFEX) 44, and the gFEX 46. The eFEX 42 and jFEX 44 provide functions similar to those of the CPMs and JEMs but benefit from a much finer granularity. Each system includes multiple modules that operate on limited regions of the calorimeter. In contrast, the gFEX 46 accesses the entire calorimeter data available in a single module, and thus enables the use of full-scan algorithms. With these benefits, the gFEX 46 maximizes flexibility of the trigger, avoids data duplication, and computes global quantities without boundaries concerning the detector.

The electromagnetic calorimeter both analog signals for the CP 32 and JEP 38 and digitized data for the FEXs 42, 44, 46. The hadronic calorimeter sends analog signals that are digitized in the pre-processor 40 and then transmitted to the FEXs 42, 44, 46 through an optical patch-panel. After adding the gFEX 46, the acceptance of two or more sub jets is recovered and the resolution is nearly the same as that of one sub-jet. The LHC is the first system that provides high enough energy to produce large numbers of boosted top quarks. The boosted top quark is a particle that can be observed and monitored and can be selected using an algorithm implemented on the gFEX 46 with substantially greater efficiency than that exhibited in conventional solutions. The decay products of these top quarks are confined to a cone in the top quark flight direction and can be clustered to a single jet. Top quark reconstruction then amounts to analyzing the structure of the jet and looking for sub jets that are kinematically compatible with top quark decay.

The gFEX receives coarse-granularity (0.2×0.2 gTower) information from the calorimeters on 276 optical fibers. Large FPGAs for data processing, a combined FPGA and SoC running an embedded system for control and monitoring, and several Avago MiniPODs for data inputs and outputs are utilized on the gFEX 46. One feature of the gFEX 46 is that it receives data from the entire calorimeter enabling the identification of large-radius jets and the calculation of whole-event observables. The FPGAs 12A-C shown in FIGS. 1-2 each have $2\pi$ azimuthal ($\varphi$) coverage for a slice in pseudorapidity ($\eta$) and executes all feature identification algorithms. The FPGAs 12A-C, 16 communicate with each other via low-latency GPIO links while input and output to the MiniPODs 14 are linked via multi-gigabit transceivers (MGTs). On-board electrical MGTs provide links between FPGAs 12A-C and the SoC 16 for data transmission and control. The reconfigurable computing platform or gFEX 46 is placed in an ATCA shelf so that the board can occupy two slots if needed: one for the board and one for cooling with, for example, a large heat sink, fiber routing, and the like.

Figure 20:
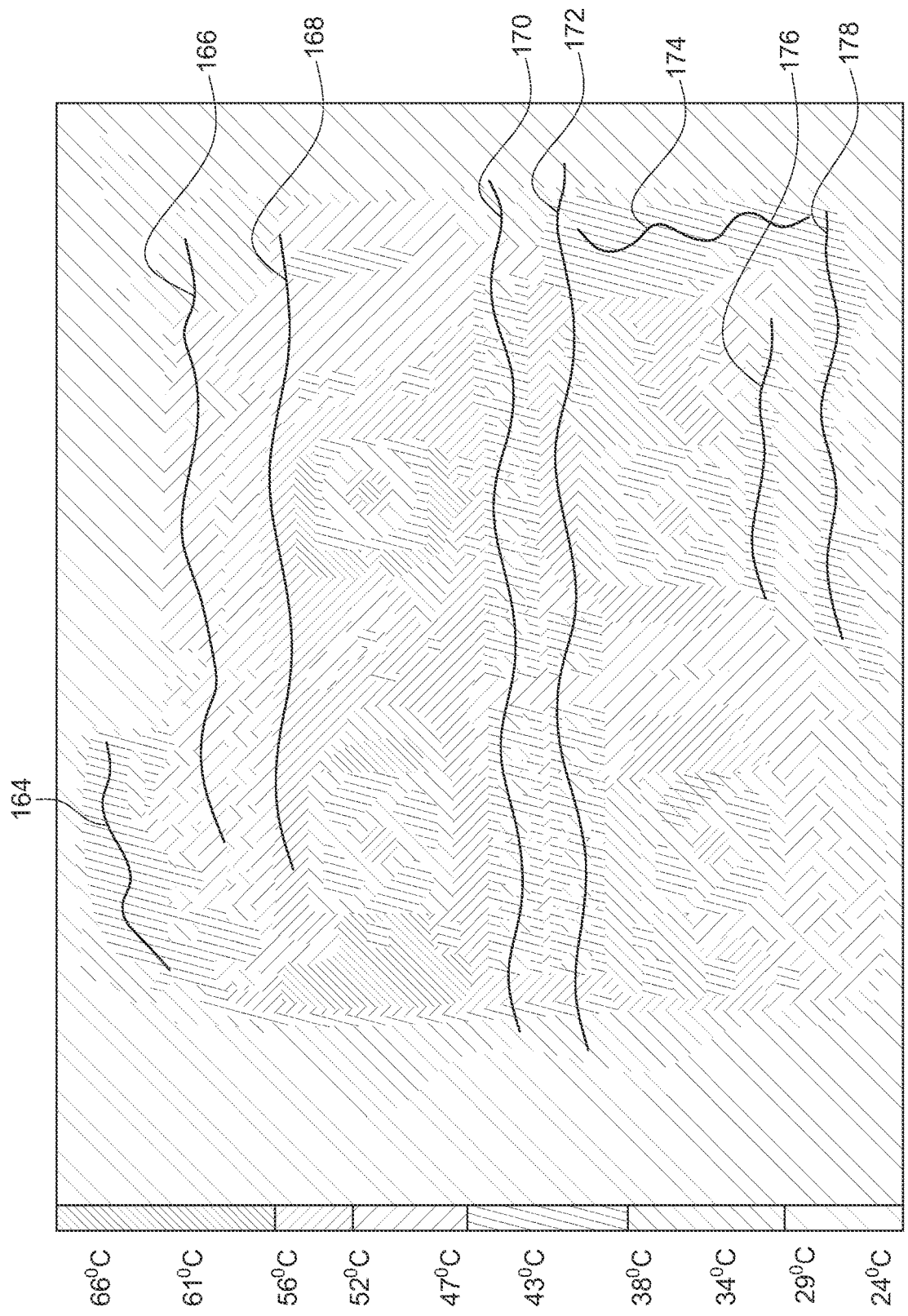
FIG. 20 shows a thermal map of the reconfigurable computing platform.

Cooling of the high-power processor FPGAs 12A-C on a single printed circuit board is a challenge, especially when the FPGAs 12A-C are surrounded by high-power optical-to-electrical converters 14. A new component placement and distribution technique is implemented in the reconfigurable computing platform 10, 20 that enables optimal forced air flow circulation to keep each component at low operational temperatures. The components are placed on the printed circuit board of the reconfigurable computing platform 10, 20 based on their height differences to define a geometry such that air flow channels are formed across the board. These channels ensure a continuous unobstructed flow of air across components that enables operating temperatures of these components to remain below 85 C, which ensures component lifetimes greater than 10 years at continuous operation. A thermal map of the reconfigurable computing platform operating at about 300 W is provided in FIG. 20 that shows this feature. Specifically, air flow channels 164, 166, 168, 170, 172, 174, 176, 178 are created as a result of placing components on the multilayer board based on their height differences. In addition, each FPGA 12A-C, 16 on the reconfigurable computing platform 10, 20 is coupled to a combination of fan and heat sink, and thus there are four fans on the reconfigurable computing platform 10, 20 to provide sufficient cooling capacity.

Figure 4:
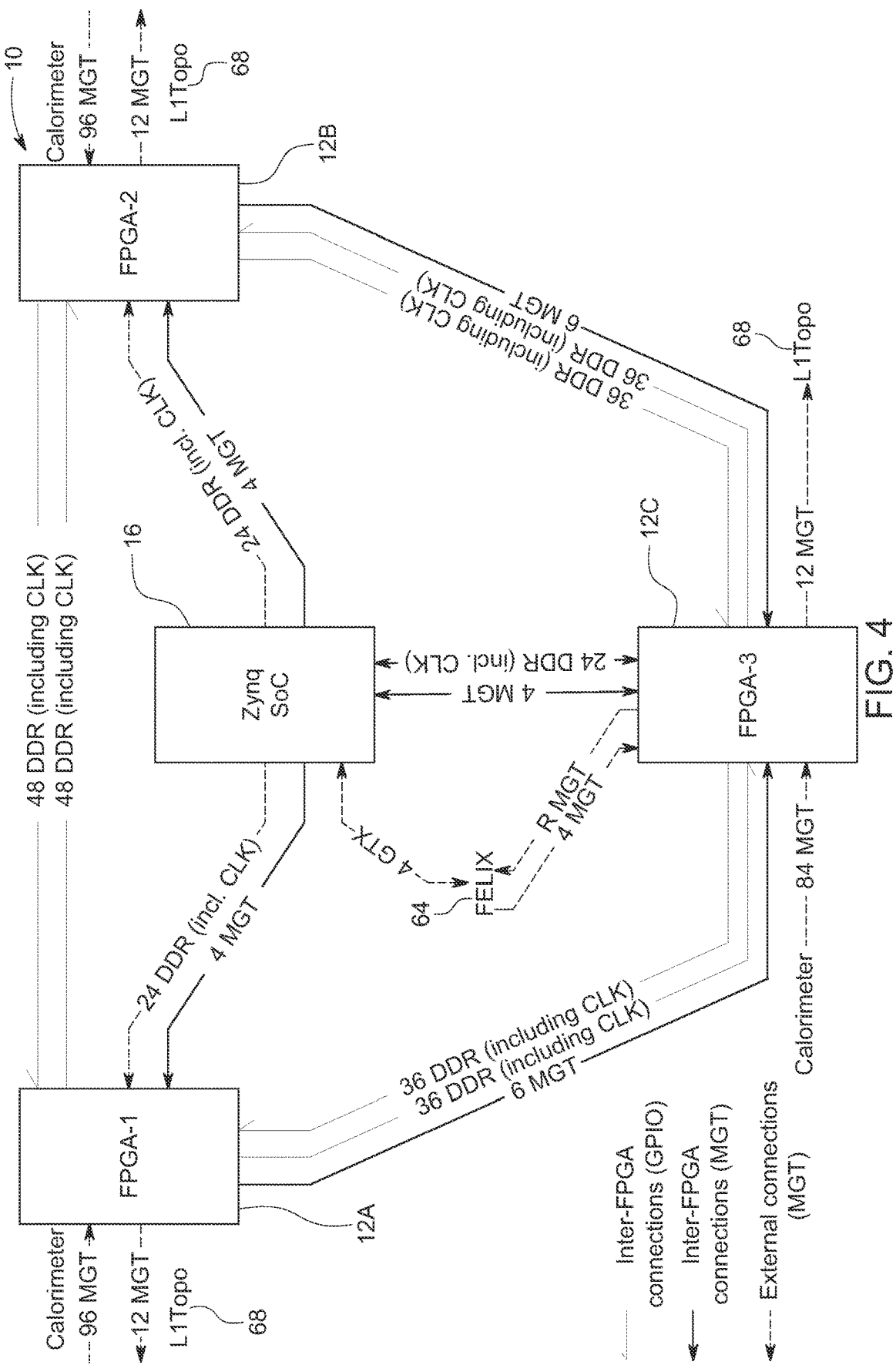
FIG. 4 shows a functional block diagram of an architecture of the embodiment of the reconfigurable computer platform shown in FIG. 1.

A functional block diagram of the reconfigurable computing platform 10 shown in FIG. 1 is shown in FIG. 4, which includes the four FPGAs 12A-C, 16 implemented on the board. Three Virtex UltraScale FPGAs are used as processor FPGAs 12A-C, and one ZYNQ FPGA 16 is used for TTC clock recovery and distribution as well as control and monitoring.

The processor FPGAs 12A-C process data from the electromagnetic and hadronic calorimeter via fiber optical links and on-board MiniPOD 14 receivers (shown in FIG. 1). After processing, the real-time trigger data from each processor FPGA 12A-C is sent through one 12-channel MiniPOD 14 transmitter. The processor FPGA-1 12A and FPGA-2 12B have similar functionalities in that both receive 96 optical inputs. The input data is processed by the feature identification algorithms implemented in the FPGA, and the trigger information is sent to each processor FPGA 12A-C directly. The processor FPGA-3 12C receives 84 optical links from the calorimeter, which meets the design requirement of 276 total input optical links.

The FPGA-3 12C also functions as an aggregator that receives data from the other two processor FPGAs 12A-B, and then sends trigger data to a front-end link exchange (FELIX). The ZYNQ FPGA 16 recovers the 40 MHz timing, trigger, and control (TTC) clock through the FELIX link. The recovered TTC clock is the source clock of the high-performance clock generator device (that is commercially available from Silicon Laboratories Inc. as part no. SI5345) with jitter-cleaning capability, which generates the reference clocks with required frequencies for the MGT links. The jitter cleaning function of the SI5345 guarantees a link operational rate above 10 Gb/s. The jitter-cleaning capability is implemented using a crystal oscillator or an external reference clock source connected to XAXB pins of the SI5345, which is used as a jitter reference by a low loop bandwidth (BW), and thus jitter attenuation feature. The FELIX 64 provides TTC clock information to the reconfigurable computing platform 10 using a GBT mode link and receives data from the reconfigurable computing platform 10 using FULL mode links. The ZYNQ 16 on the reconfigurable computing platform 10 recovers the TTC clock from the GBT link and sends the recovered TTC clock to the jitter cleaning clock generator SI5345 to improve clock quality, which generates the reference clock for the FULL mode links to the FELIX 64. With this configuration, both the GBT mode link at 4.8 Gb/s and FULL mode link at 9.6 Gb/s are established between FELIX and reconfigurable computing platform 10 successfully.

In the embodiment shown in FIGS. 1 and 4, the reconfigurable computing platform 10 is a 26-layer board with 28 MiniPODs. The reconfigurable computing platform 10 is designed and manufactured with low-loss material Megtron-6. Back-drilling technology is adopted in the fabrication to minimize the influence of stubs on high-speed link performance. Compared to blind via technology, back drilling is more cost effective and results in greater signal fidelity. The processor FPGA-1 12A and FPGA-2 12B both receive 96 optical inputs, the FPGA-3 12C receives 84 optical links from the calorimeter, and the ZYNQ 16 is used to control and monitor the board.

Figure 5:
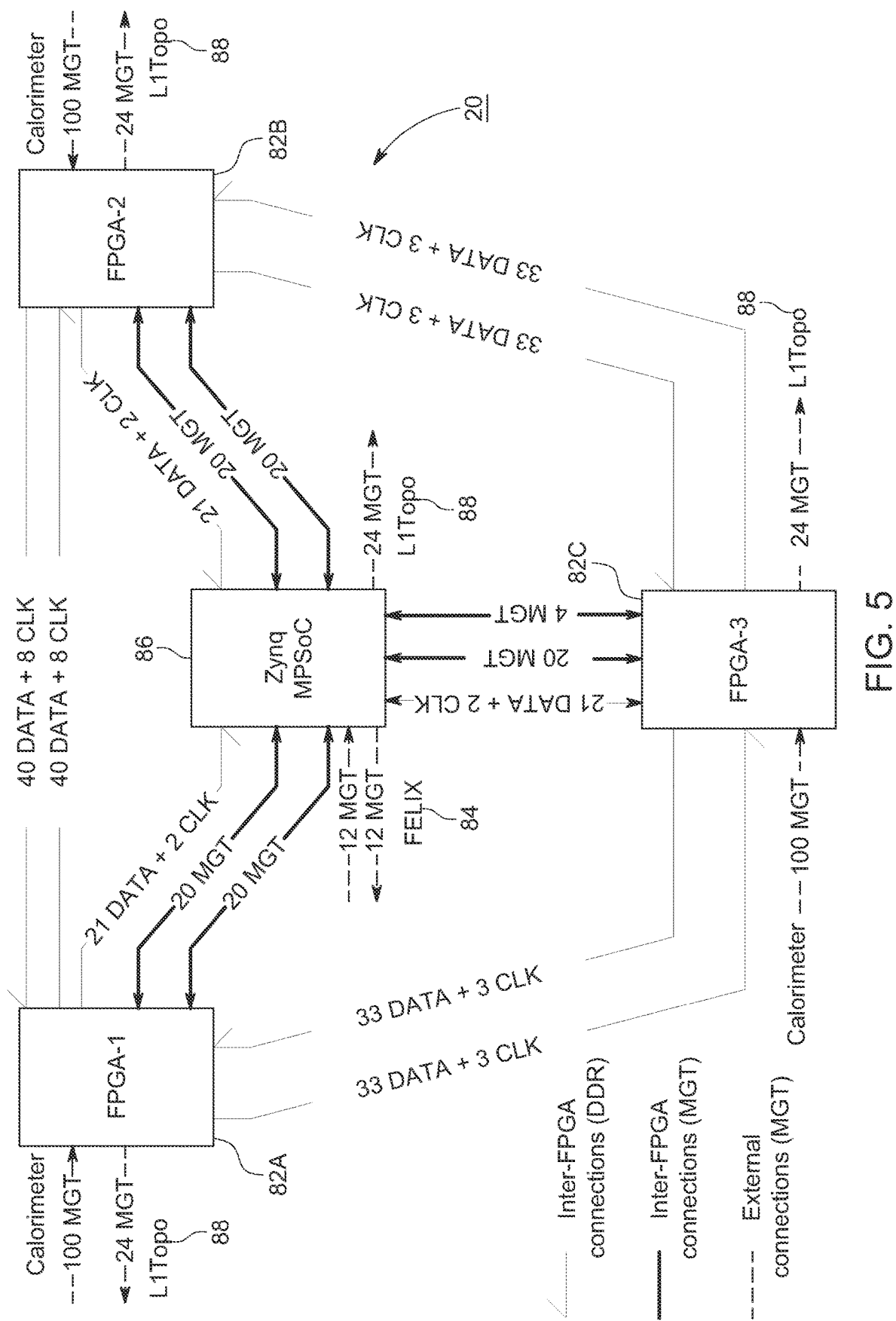
FIG. 5 shows a functional block diagram of an architecture of the embodiment of the reconfigurable computer platform shown in FIG. 2.

A functional block diagram of the architecture of the reconfigurable computing platform 20 shown in FIG. 1 is shown in FIG. 5. As compared with the reconfigurable computing platform 10 shown in FIG. 4, the reconfigurable computing platform 20 uses a Vertex UltraScale+ for the three processor FPGAs 82A-C and replaces the ZYNQ 66 with a ZYNQ UltraScale+ FPGA 86. To take advantage of the resources of ZYNQ UltraScale+ 86, the interfaces of the processor FPGA-3 82C are moved to the ZYNQ UltraScale+ 86. With the Vertex UltraScale+ FPGAs 82A-C, each of the transceivers are GTYs and there are significantly more 25.6 Gb/s links on-board. All three processor FPGAs 82A-C send trigger data to the ZYNQ UltraScale+ 86 via eight 25.6 Gb/s GTY links and twelve 12.8 Gb/s GTH links. The ZYNQ UltraScale+ 86 transfers this trigger data to the FELIX 84 through 12 channels of MGT links. After removing the FELIX connection, the processor FPGA-3 82C receives 100 optical links from the calorimeter and transmits real-time data via 24 optical links to L1Topo 88 as do the remaining two processor FPGAs 82A-B. With increased optical inputs and outputs, the total number of MiniPODs is increased from 28 to 35. These improvements provide better compatibility for the reconfigurable computing platform 20 to be used in the high-luminosity LHC (HL-LHC) that includes as many as 24 output fiber links.

Figure 6:
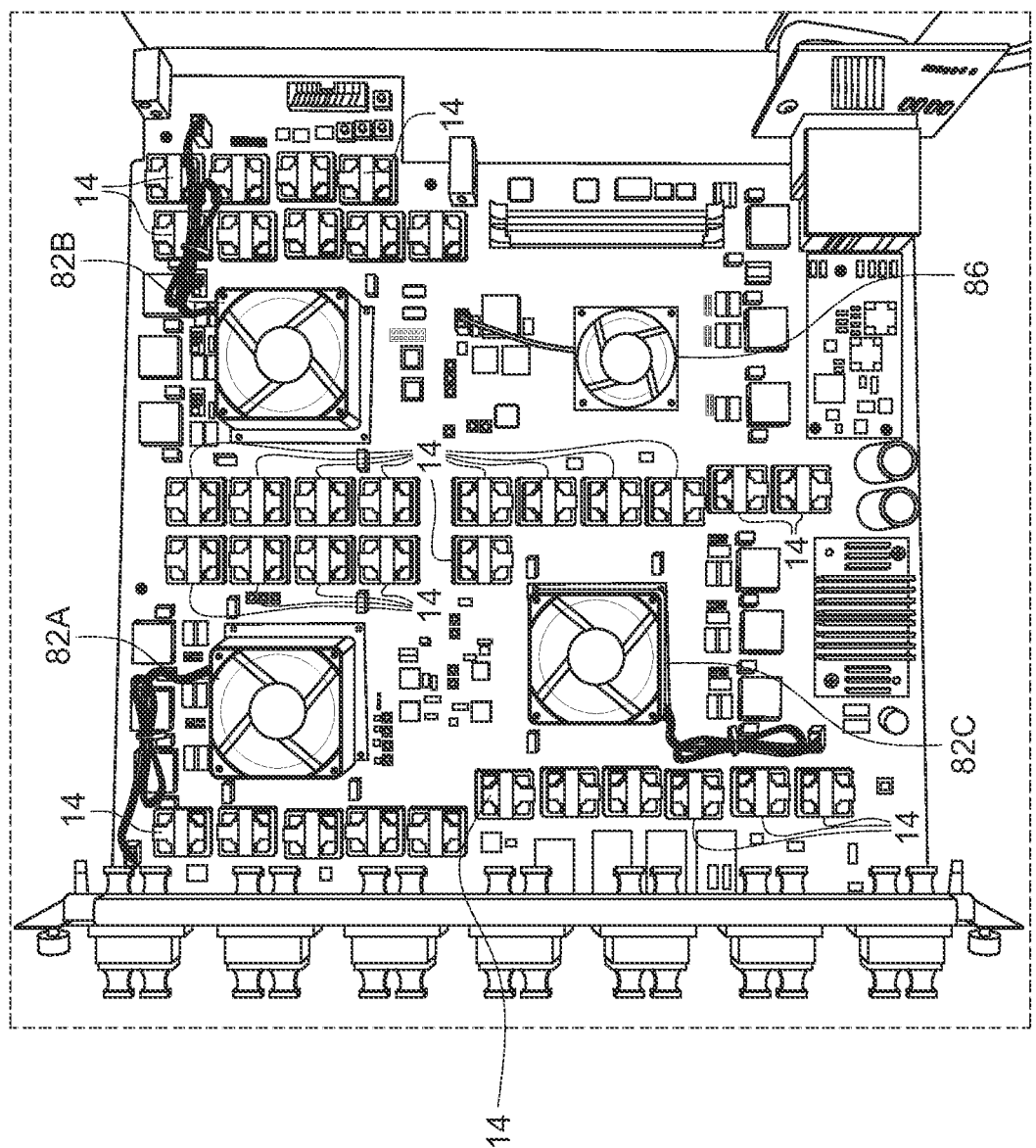
FIG. 6 shows a top view of the embodiment of the reconfigurable computer platform shown in FIG. 1.

With more MiniPODs 14 and incorporation of the ZYNQ UltraScale+ FPGA 86, the board stack up is increased from 26 to 30 layers. The same PCB material and back drilling technologies are used as discussed above in relation to the reconfigurable computing platform 10. The fully assembled reconfigurable computing platform 20 is shown in FIG. 6. All four FPGAs 82A-C, 86 are configurable via JTAG and QSPI flash.

The IBERT test was performed to verify that all MGT links were stable at 12.8 Gb/s without any errors being detected. The twenty-four (24) on-board electrical GTY links from three processor FPGAs 82A-C to the ZYNQ UltraScale+ 86 are stable at 25.6 Gb/s.

Figure 7:
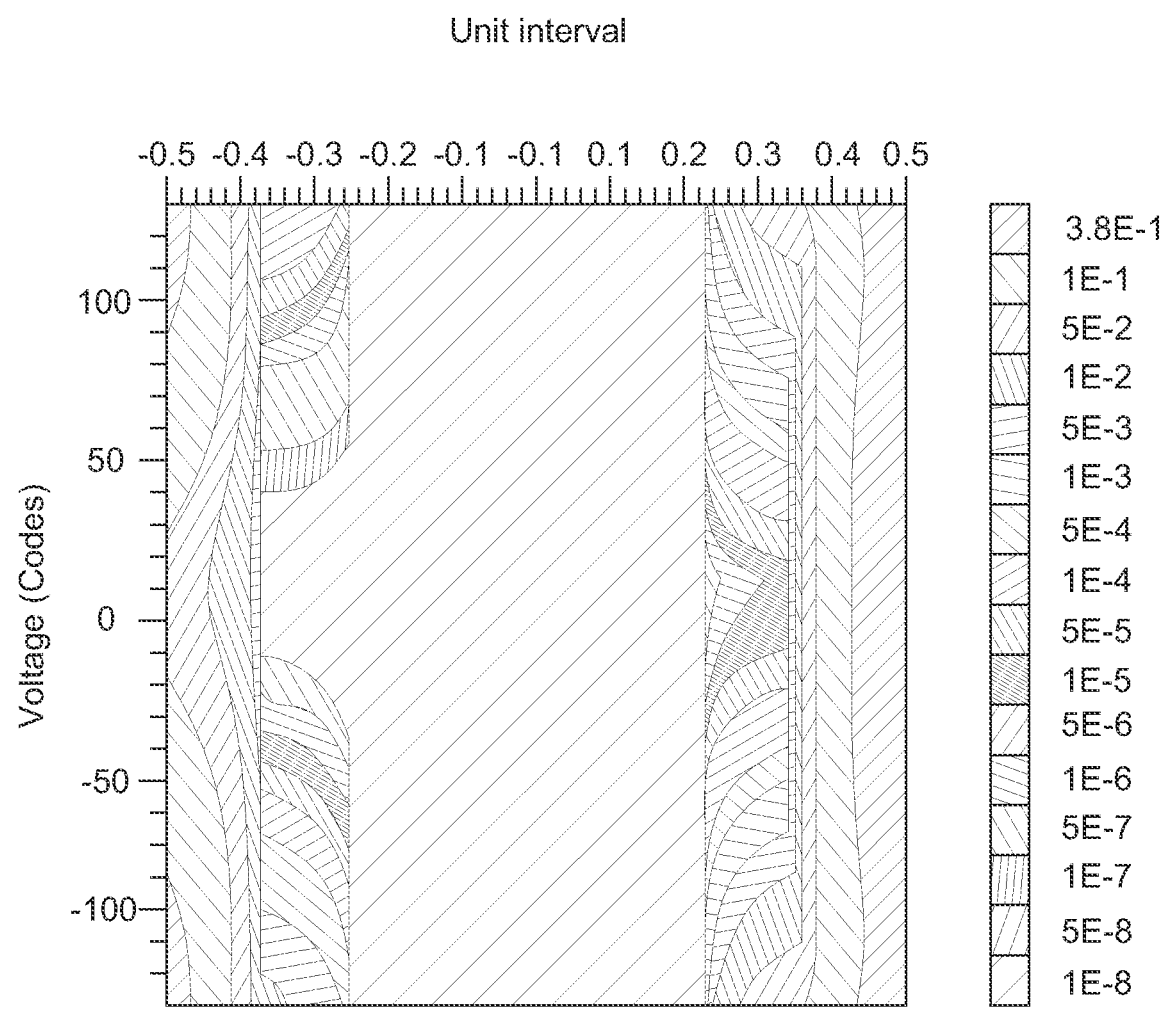
FIG. 7 shows an eye diagram of an optical link from a processor UltraScale+ field programmable gate array (FPGA) GTY transmitter to a GTY receiver through MiniPODs and optical fibers.
Figure 8:
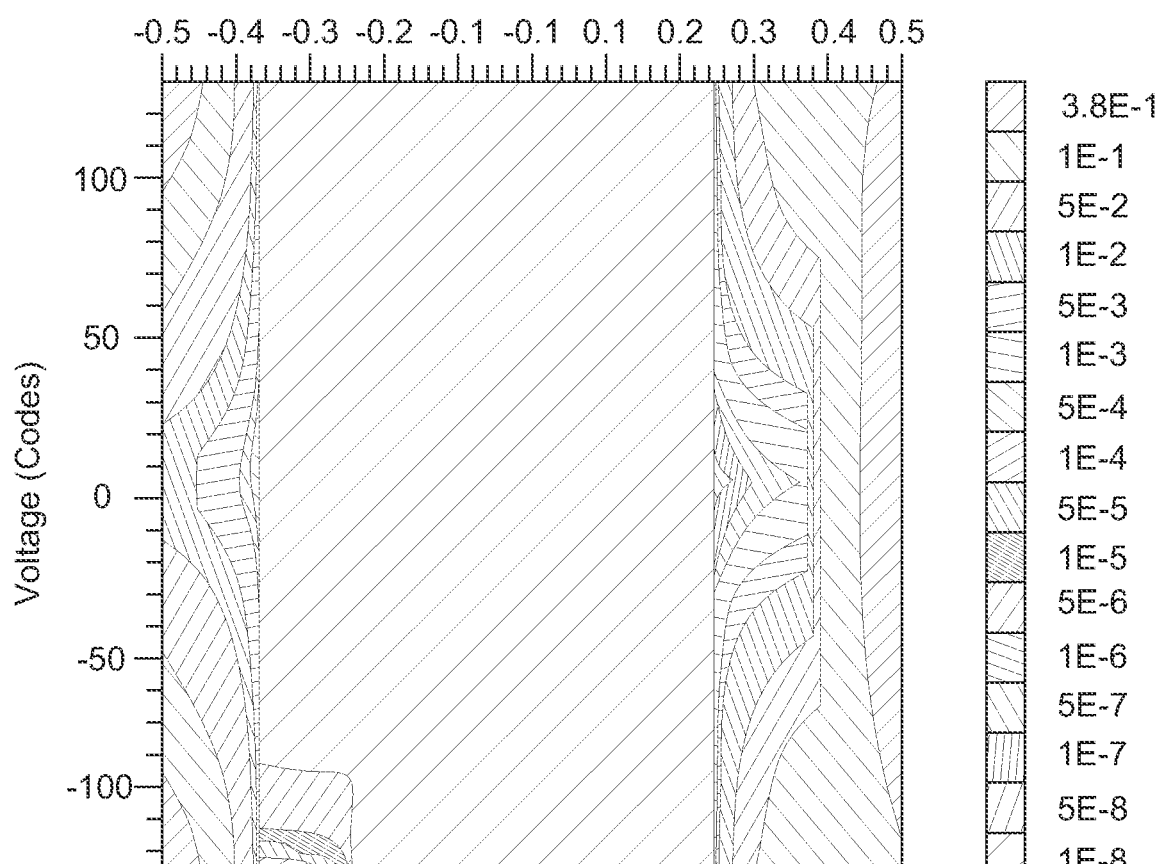
FIG. 8 shows an eye diagram of an electrical link from the processor UltraScale+ FPGA GTY transmitter to the ZYNQ UltraScale+ GTY receiver.
Figure 9:
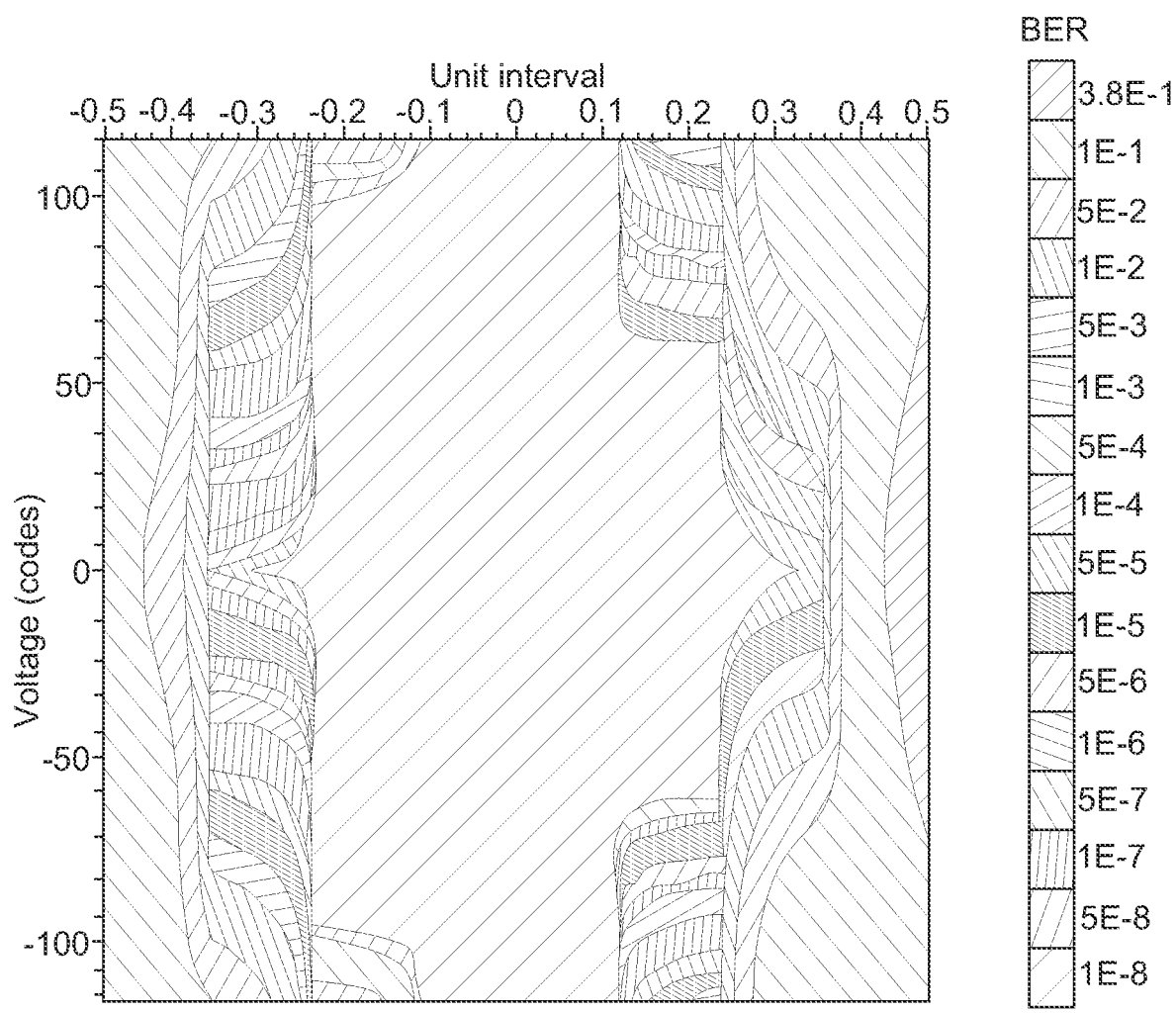
FIG. 9 shows an eye diagram of an on-board electrical link from the processor UltraScale+ FPGA GTY transmitter to the ZYNQ UltraScale+ GTY receiver.

An eye diagram of the optical link at 12.8 Gb/s is shown in FIG. 7 for the optical link from processor UltraScale+ FPGA GTY transmitter to GTY receiver passing through MiniPODs and fibers. The open area in this eye diagram is 10,048 at 12.8 Gb/s. Eye diagrams for the 12.8 Gb/s and 25.6 Gb/s on-board 8-inch electrical links are shown in FIGS. 8 and 9, respectively. FIG. 8 shows an eye diagram of the electrical link from processor UltraScale+ FPGA GTY transmitter to ZYNQ UltraScale+ GTY receiver. The open area in this eye diagram is 13,922 at 12.8 Gb/s. FIG. 11B shows an eye diagram of the on-board electrical link from processor UltraScale+ FPGA GTY transmitter to ZYNQ UltraScale+ GTY receiver. The open area in this eye diagram is 8,576 at 25.6 Gb/s. In telecommunications, an eye pattern, also known as an eye diagram, is an oscilloscope display, in which a digital signal from a receiver is repetitively sampled and applied to the vertical input, while the data rate is used to trigger the horizontal sweep. It is so called because, for several types of coding, the pattern looks like a series of eyes between a pair of rails. It is a tool for the evaluation of the combined effects of channel noise and inter-symbol interference on the performance of a baseband pulse-transmission system. It is the synchronized superposition of all possible realizations of the signal of interest viewed within a particular signaling interval.

Several system performance measures can be derived by analyzing eye diagram. If the signals are too long, too short, poorly synchronized with the system clock, too high, too low, too noisy, or too slow to change, or have too much undershoot or overshoot, this can be observed from the eye diagram. An open eye pattern corresponds to minimal signal distortion. Distortion of the signal waveform due to inter-symbol interference and noise appears as closure of the eye pattern.

A top view of another embodiment of the reconfigurable computing platform 100 includes a power input source of 48V that is converted to 12V by one DC-DC quarter brick module. Thirteen (13) LTM4630As with 26 A current capability are used to step down the 12V to 0.95V, 1.0V, 1.2 V, 1.8 V, 2.5 V, and 3.3 V. To meet the large current requirements of the Xilinx FPGAs 102A-C, each Virtex Ultrascale FPGA is powered using three (3) LTM4630A voltage regulators (which are available from Linear Technology Corporation).

Figure 21:
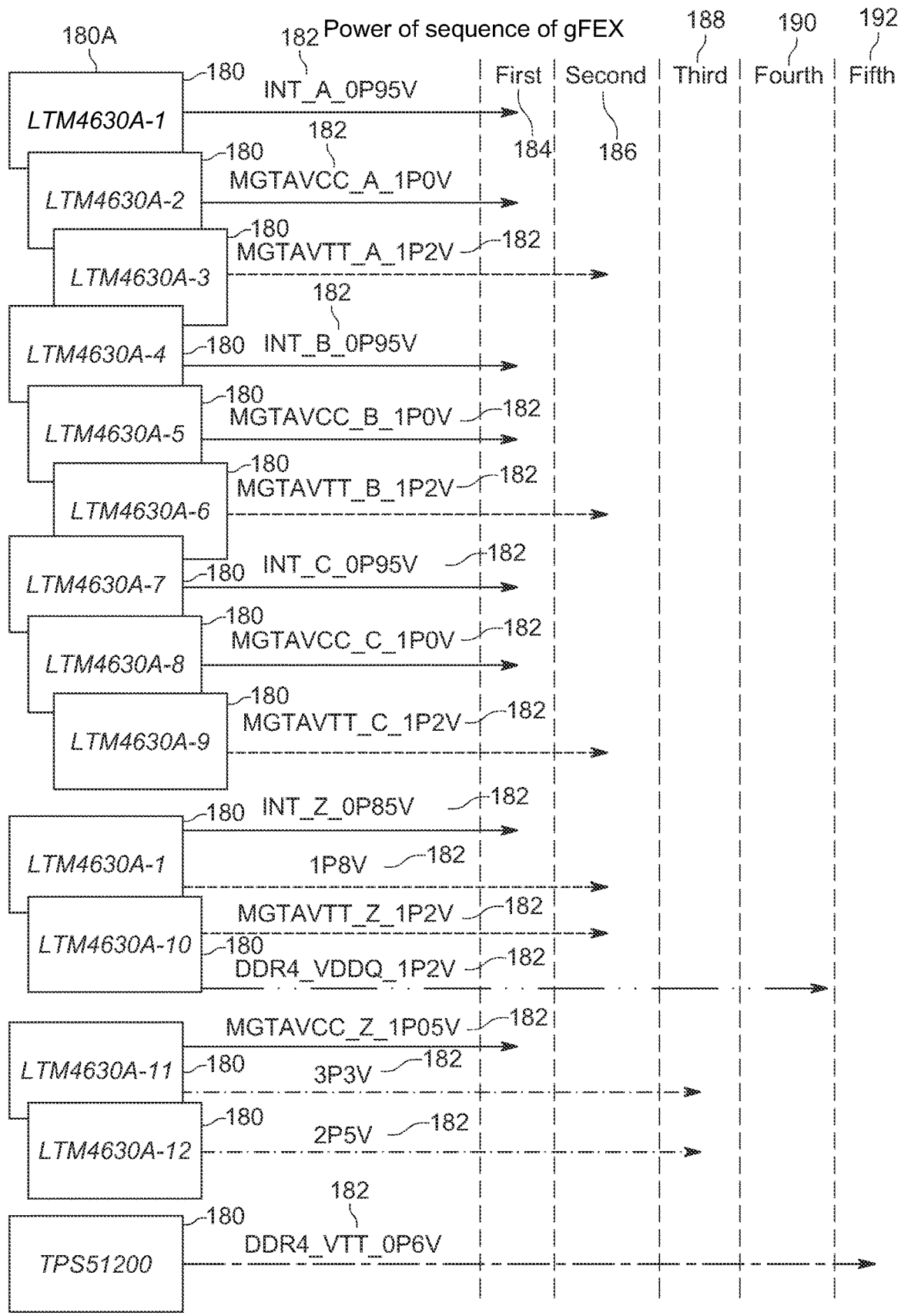
FIG. 21 shows a power sequence of the reconfigurable computing platform.

To protect and manage the power sequence of the board, two power monitoring and management devices (which are commercially available from Analog Devices, Inc. as part no. ADM1066) are used. The ADM1066 is programmable through the I2C bus, and thus the power sequence can be defined based on over-voltage and under-voltage requirements. FIG. 21 shows the power sequence of the reconfigurable computing platform 10, 20. The various regulators 180 are shown along the left-hand side of the diagram connected to a series of arrows 182 that terminate in one of five columns marked first 184, second 186, third 188, fourth 190, and fifth 192. The column 184, 186, 188, 190 in which a particular arrow terminates indicates the relative time at which power is applied to the regulator 180 corresponding to that arrow in the power sequence. For example, regulator 180A is connected to arrow 182A, that terminates in column 184, which indicates that power will be applied to the regulator 182A first in the power sequence.

There are nine groups of parallel data buses on the reconfigurable computing platform 100. Six groups of parallel data buses are used to communicate between each pair of Virtex FPGAs 102A-C and the remaining three groups of parallel data buses are used to communicate between the ZYNQ 104 and each of the Virtex FPGAs 102A-C. For each of the nine groups of parallel data buses, the data rate is 1.12 Gb/s for each data line.

For the multi-gigabit transceiver (MGT) design, three types of MGTs are used on the reconfigurable computing platform 100; GTX on the ZYNQ 104, and GTH and GTY on the Virtex FPGAs 102A-C. For the MGT connections, 280 links are connected to the MiniPOD receivers 14 and 40 links are connected to the MiniPODs transmitters 14. In addition, there are 6 GTY on-board connections between processor FPGAs 102A and 102C, and FPGAs 102A and 102B, respectively, which can operate at up to 25.6 Gb/s.

The ZYNQ 104 is used to recover the TTC clock and control the reconfigurable computing platform 100, which includes monitoring, configuration, and facilitating remote upgrades, and the like. The Gigabit Ethernet, QSPI interface, 4 Gb DDR3 memories, I2C interface, UART, and SD card interface are implemented with the Xilinx processing system (PS).

With the IP-IDELAYE3, which is an IP core provided by Xilinx, the delay in each of the data lines in the ultrascale FPGA is adjustable. The adjustment has 511 steps with each step representing approximately 9.8 ps of delay. The parallel data buses operate at up to 560 MHz or 1.12 Gb/s.

Figure 11:
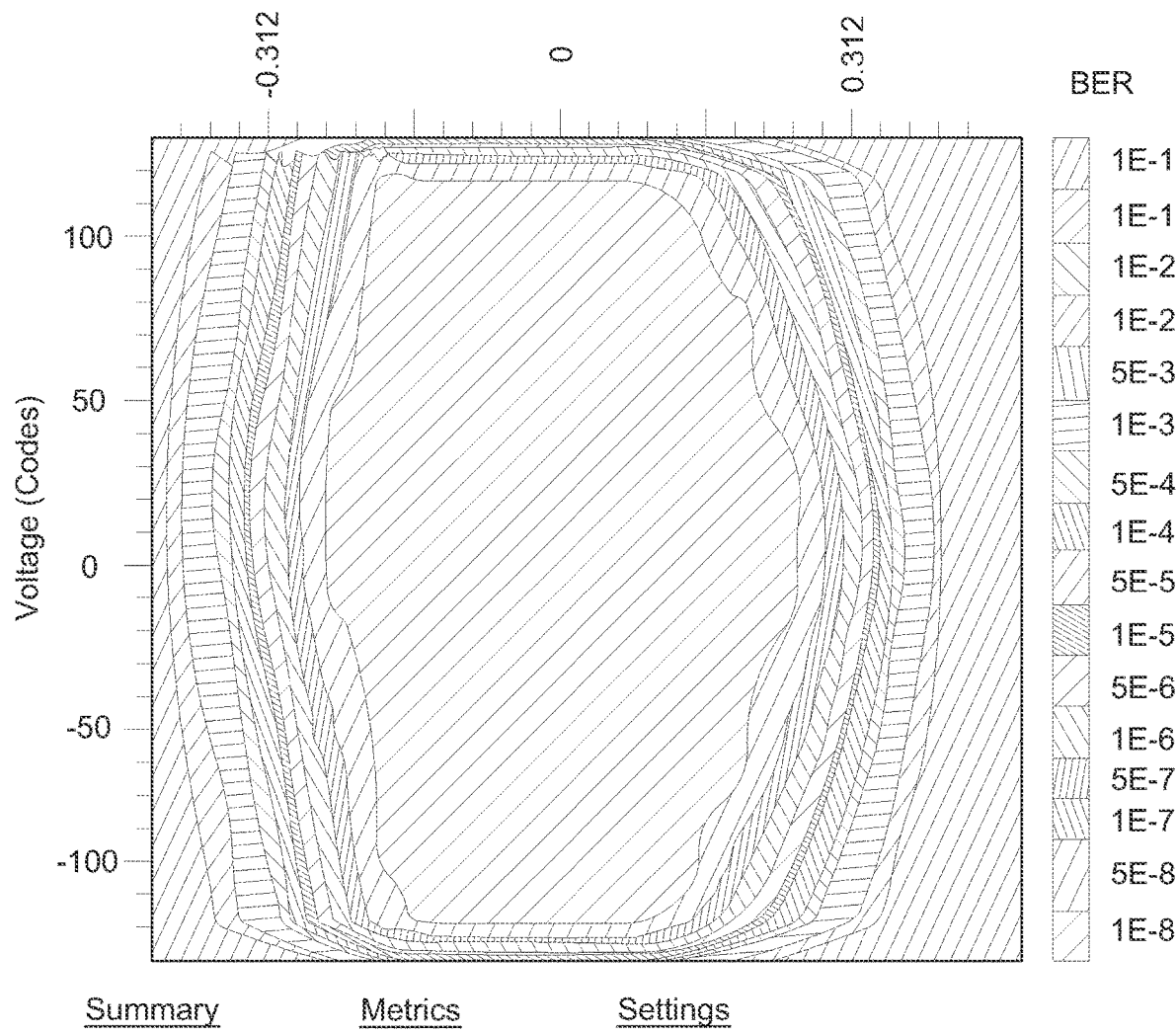
FIG. 11 shows an eye diagram for GTY optical links at 12.8 Gb/s.
Figure 12:
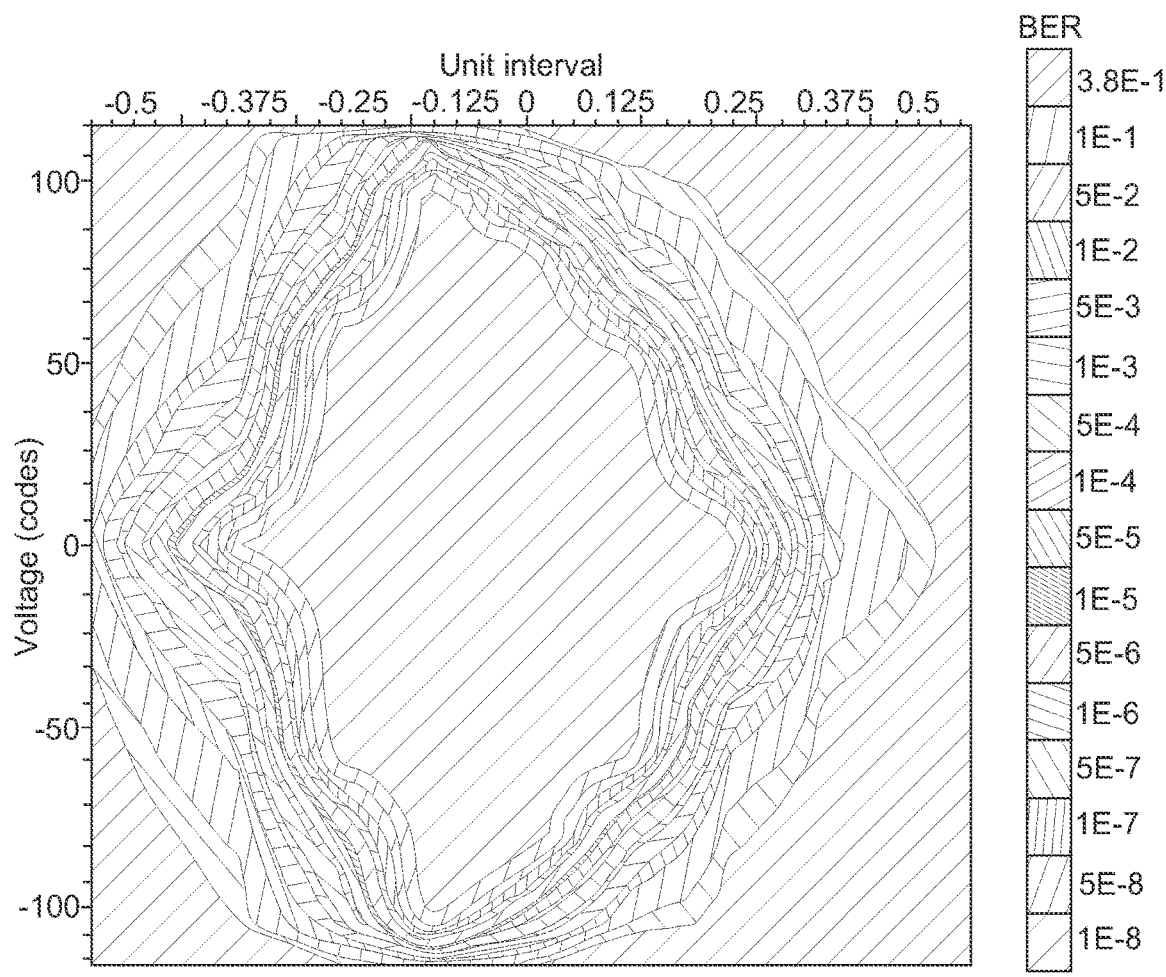
FIG. 12 shows an eye diagram for GTY onboard electrical links at 25.6 Gb/s.

The optical and electrical links are stable at 12.8 Gb/s and the GTY electrical links are stable at up to 25.6 Gb/s without errors in response to performing the IBERT test to 1E-15. FIG. 11 and FIG. 12 show eye diagrams at 12.8 Gb/s and 25.6 Gb/s for the GTY, respectively.

Figure 13:
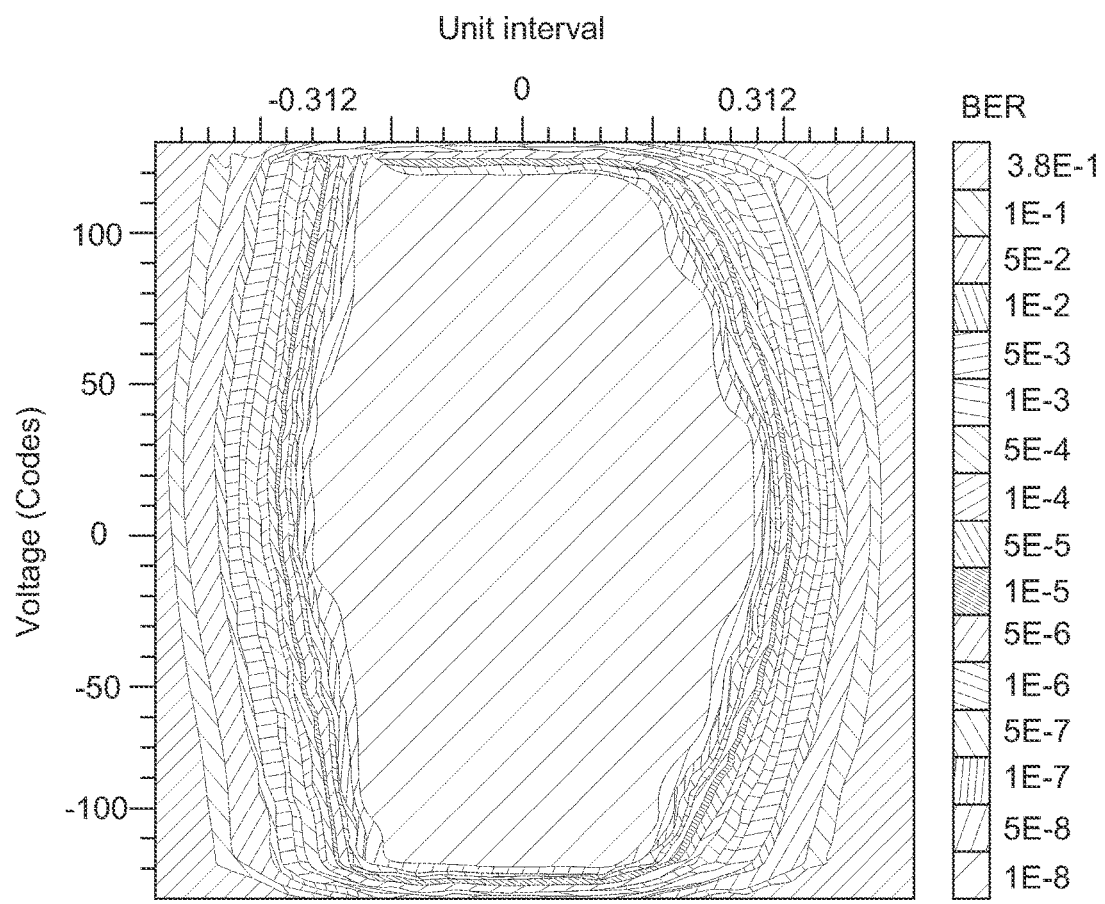
FIG. 13 shows an eye diagram for GTY optical links at 12.8 Gb/s.
Figure 14:
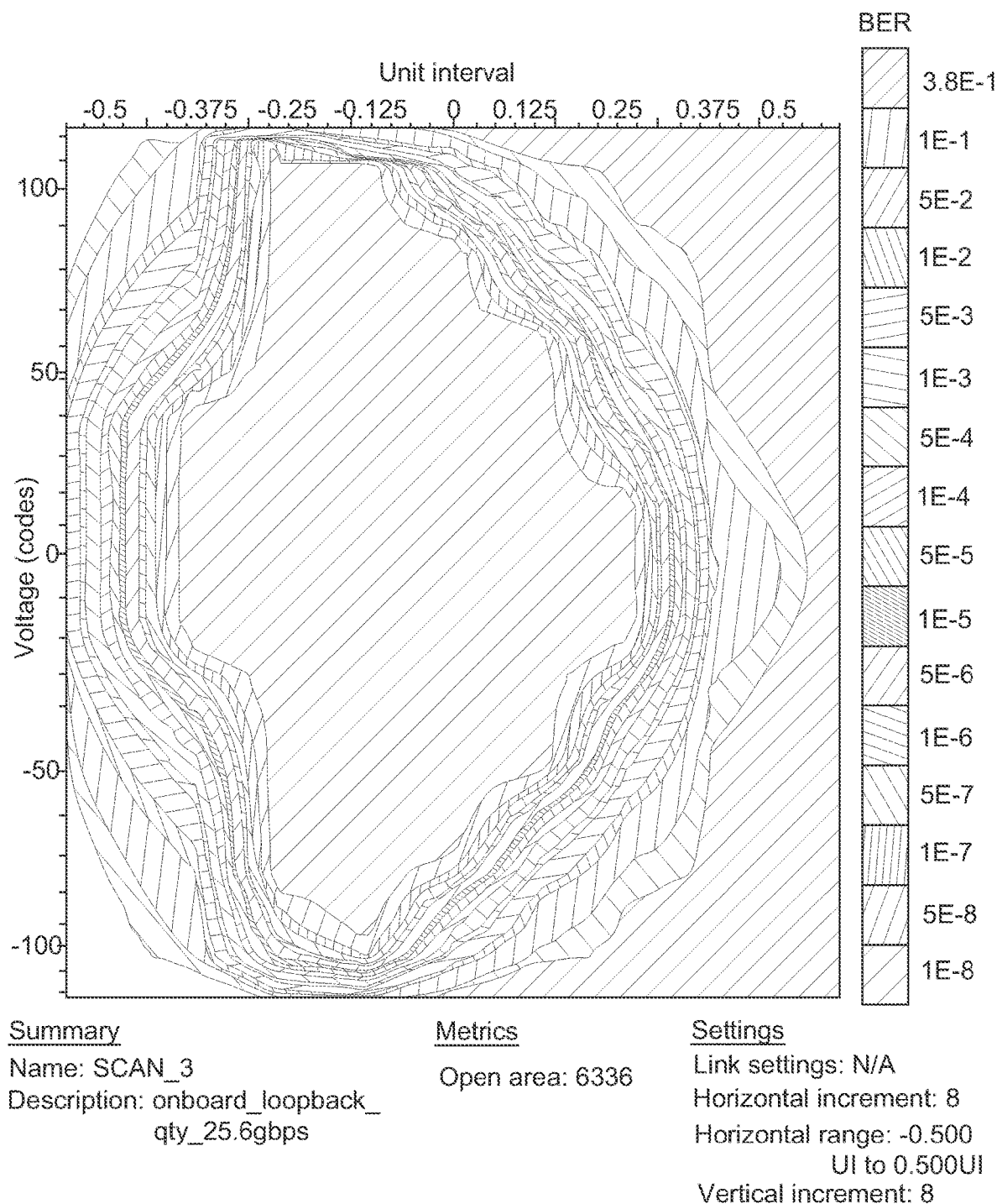
FIG. 14 shows an eye diagram for GTY onboard electrical links at 25.6 Gb/s.

A 40 MHz TTC clock is provided through the GBT link at 4.8 Gb/s and data from the reconfigurable computing platform 100 is provided at 9.6 Gb/s. The reconfigurable computing platform 100 recovers the 40 MHz TTC clock from the GBT link and uses the on board jitter clearing device (which is commercially available from Silicon Devices Inc. as part no. Si5345) to improve the clock quality. Using the recovered TTC clock, the GTH operates at links speeds of 12.8 Gbps and 25.6 Gbps. The corresponding eye diagrams are shown in FIG. 13 and FIG. 14 for 12.8 Gbps and 25.6 Gbps, respectively.

Figure 10:
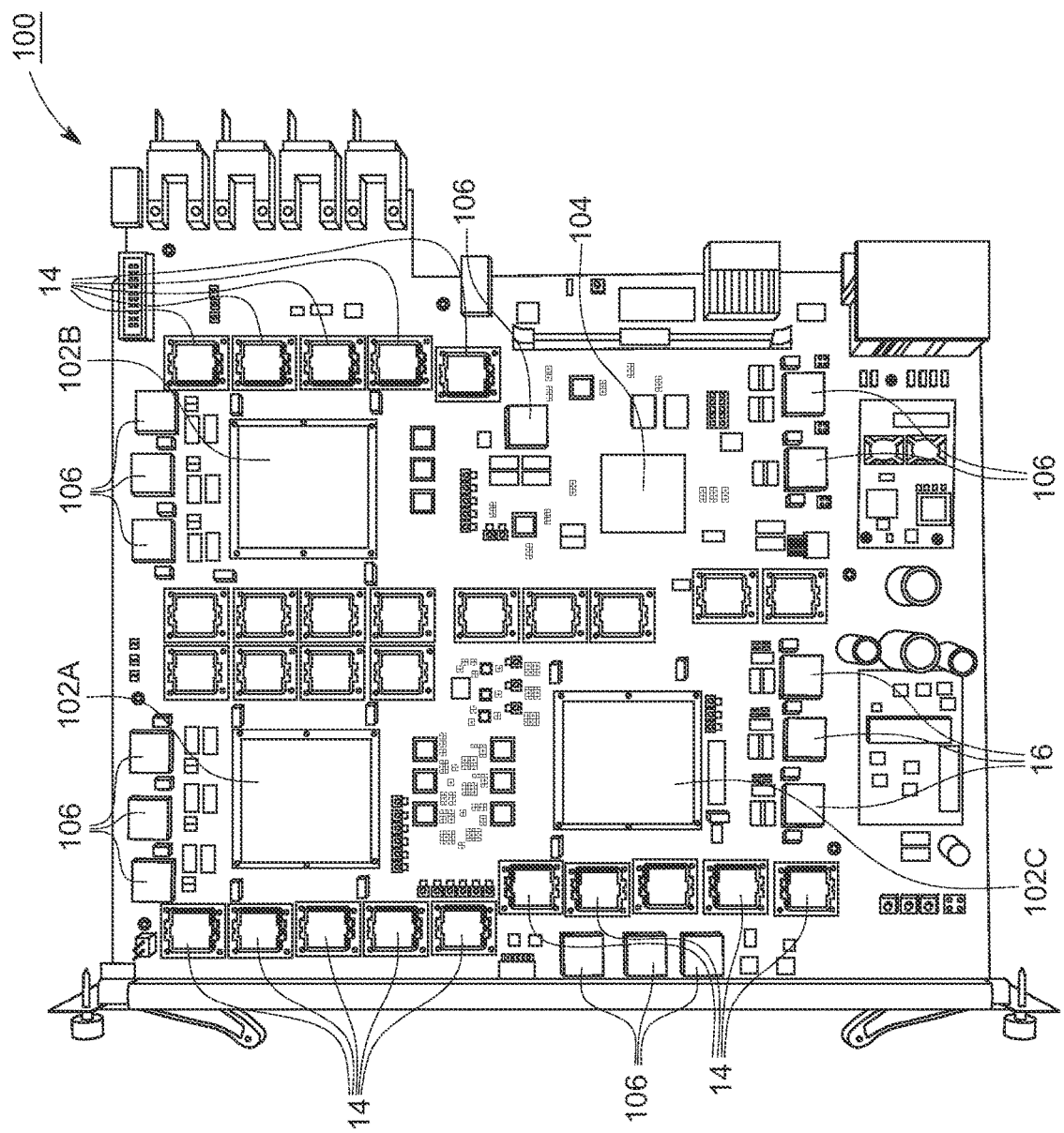
FIG. 10 shows a top view of the embodiment of the reconfigurable computer platform shown in FIG. 2.
Figure 15:
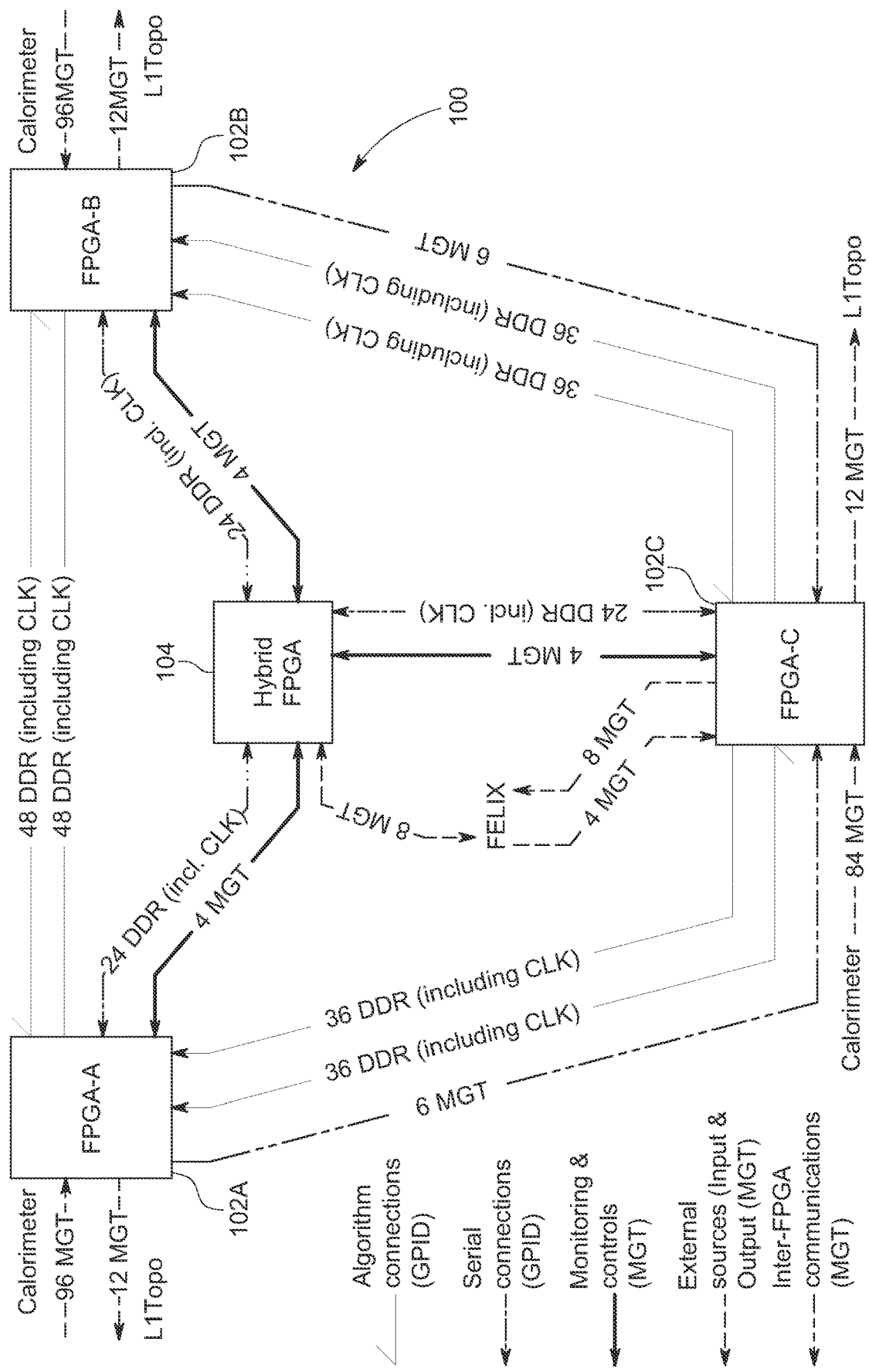
FIG. 15 shows a functional block diagram of another embodiment of the reconfigurable computer platform.

A functional block diagram of the architecture for the reconfigurable computing platform 100 shown in FIG. 10 is shown in FIG. 15 and includes a single module with FPGAs 102A-C for data processing and a combined FPGA and CPU System-on-Chip (Hybrid FPGA) 104 for control and monitoring. A feature of the reconfigurable computing platform 100 is that it receives data from the entire calorimeter, enabling the identification of large-radius jets and the calculation of whole-event observables. Each processor FPGA 102A-C provides $2\pi$ azimuthal ($\varphi$) coverage for a slice in pseudorapidity ($\eta$) and executes all feature identification algorithms. The processor FPGAs 102-C communicate with each other via low-latency GPIO data buses while the input and output interface is provided by multi-gigabit transceivers (MGTs). The reconfigurable computing platform 100 is a customized ATCA module based on the PICMG® 3.0 Revision 3.0 specification. The reconfigurable computing platform 100 is designed to verify functionalities of selected technical solutions, which include the power-on sequence, power rails monitor, clock distribution, MGT link speed, and high-speed parallel GPIOs.

Figure 16:
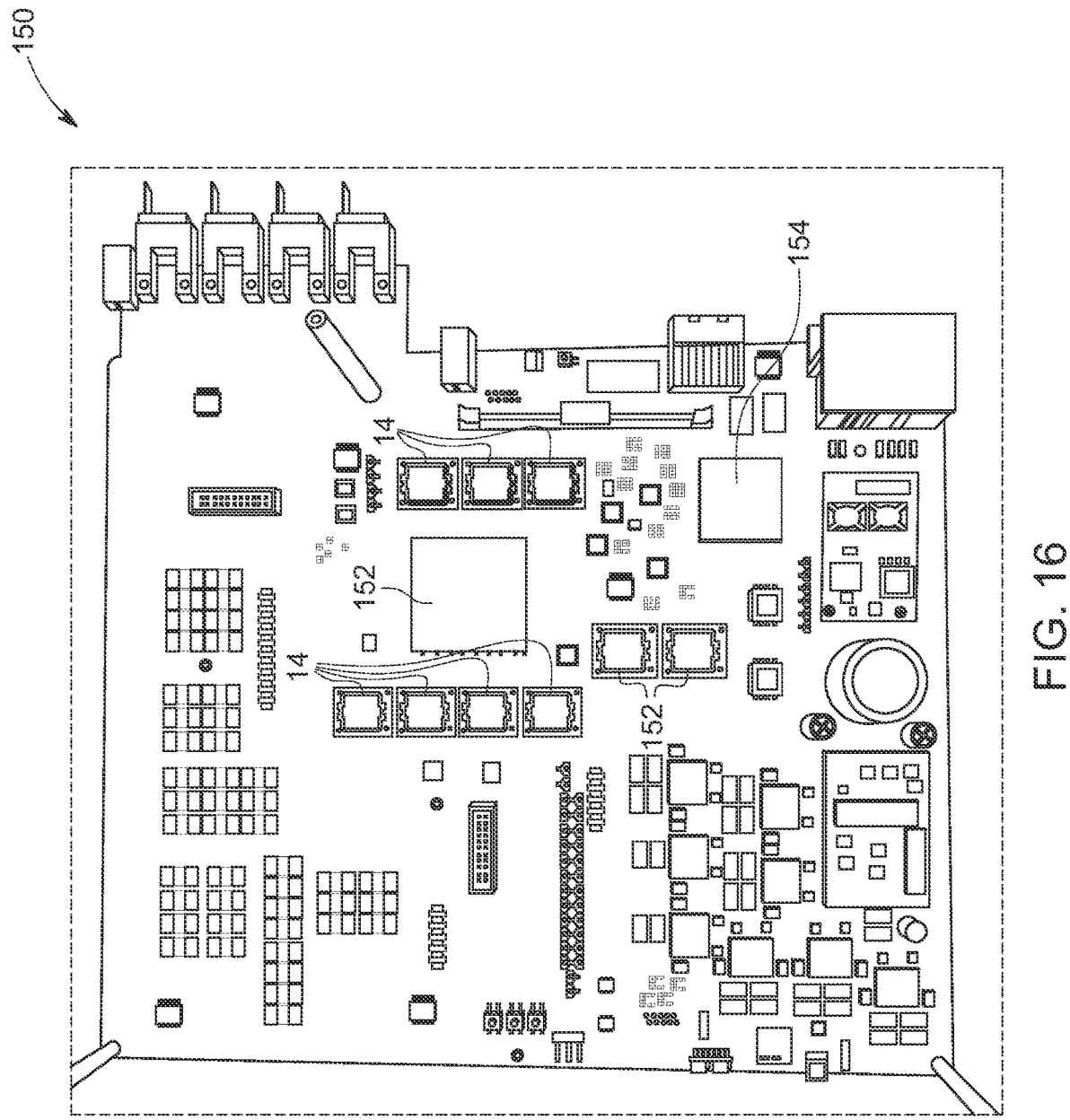
FIG. 16 shows a top view of the embodiment of the reconfigurable computer platform shown in FIG. 15.

Another embodiment of the reconfigurable computing platform 150 is shown in FIG. 16, one Hybrid FPGA (ZYNQ) 154 and one processor FPGA 152 are included in the reconfigurable computing platform 150, as well as MiniPODs 14, MicroPODs, power modules, and high speed parallel GPIOs.

The reconfigurable computing platform 150 uses a clock recovered from a FELIX link, and FELIX receives clock information from the timing, trigger and control (TTC) source. Since the recovered clock is improved for high-speed links, especially for links running at speeds above 10 Gb/s, a clock generator is implemented on the reconfigurable computing platform 100.

Figure 17:
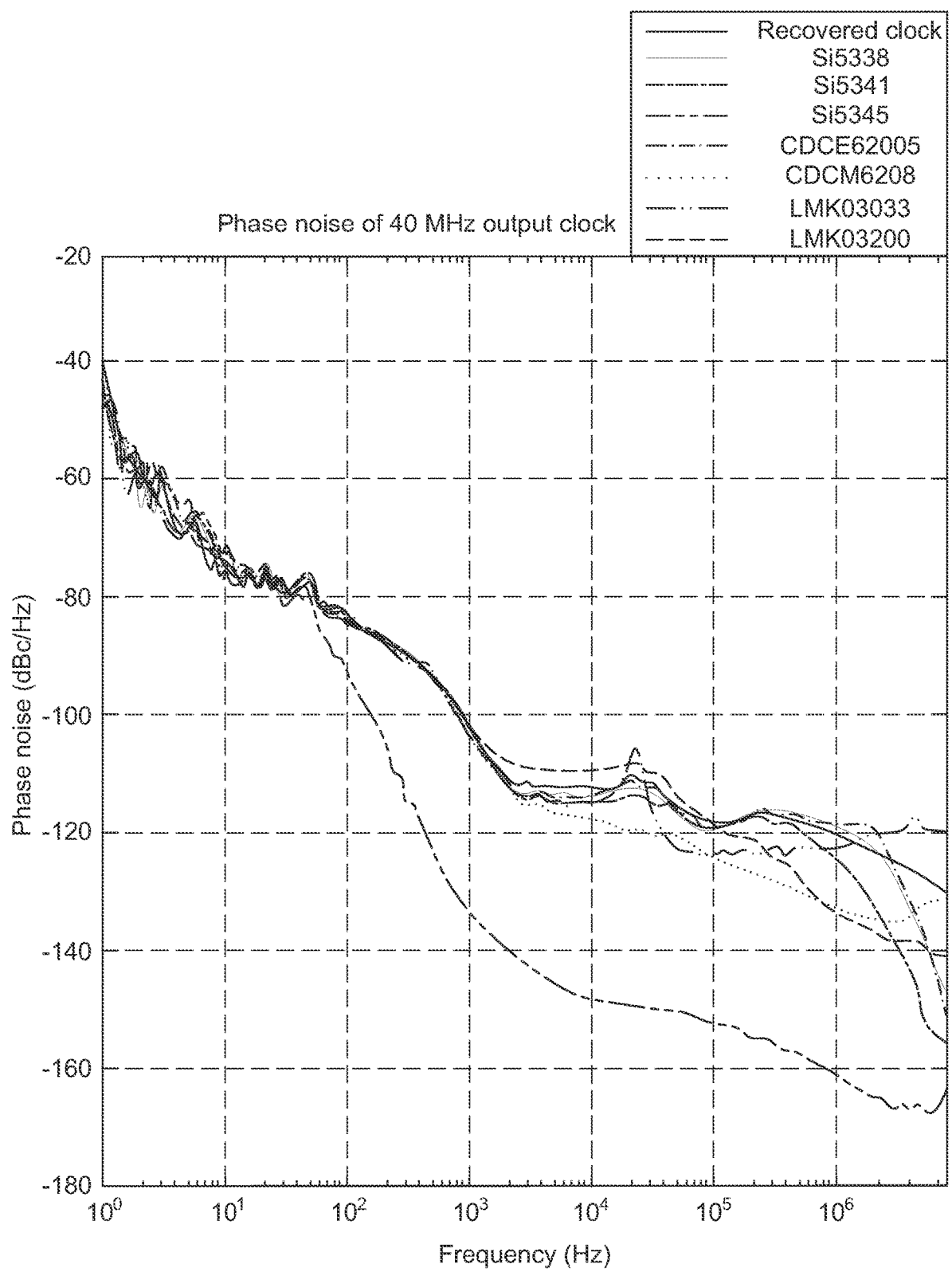
FIG. 17 shows a graph of phase noise as a function of frequency for clock generator output clocks.

The input clocks of the clock generator is the recovered clock in the reconfigurable computing platform 150, and the frequency of the output clocks is 40 MHz. The phase noise of the clock generator chips is shown in FIG. 17. As the test results show, the clock generator Si5345 performs jitter cleaning to improve the recovered clock quality.

The reconfigurable computing platform 150 is a 26 layer board that includes 26 MiniPODs 14 mounted thereon. Back drilling technology is adopted in the fabrication of the reconfigurable computing platform 150 to reduce the influence of stubs on high-speed link performance.

The reconfigurable computing platform 150 receives shaped analog pulses from the electromagnetic and hadronic calorimeters, digitizes and synchronizes these analog pulses, identifies a bunch collision from which each pulse originates, scales the digital values to yield transverse energy (TE), and prepares and transmits the data to downstream elements. The electromagnetic calorimeter provides both analog signals (for the CP and JEP) and digitized data (for the gFEXes). The hadronic calorimeter sends analog signals, which are digitized on the reconfigurable computing platform 150 and transmitted optically to the FEXes through an optical fiber. The eFEX and jFEX operate in parallel with the CP and JEP.

The reconfigurable computing platform 150 receives data from the electromagnetic and hadronic calorimeters using optical fibers. For most of the detectors, the so-called gTowers correspond to an area of $\Delta\eta \times \Delta\varphi = 0.2 \times 0.2$. There are 276 MGTs signals from the calorimeters, which are converted from optical signals on the reconfigurable computing platform 150. The control and clock signals are inputs and the combined data is transmitted using eight MGTs.

Real time data is provided to the L1 topological trigger (L1Topo) by the three processor FPGA with 12 MGTs. The data received by processor FPGA 152 is sent to FPGA 154 and then combined with the data from processor FPGA 152.

Figure 18:
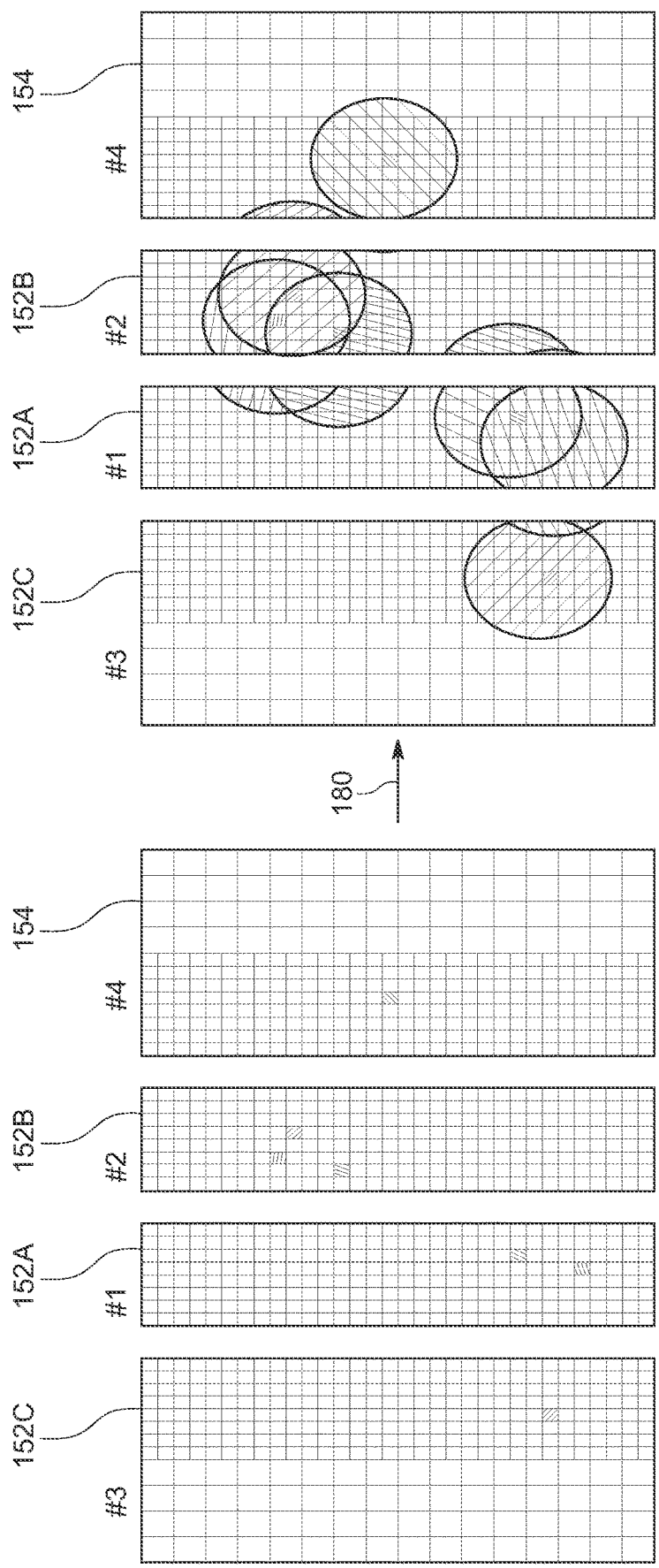
FIG. 18 shows seeds identified in an event.

Core trigger algorithms are implemented in the firmware of the processor FPGA 152. The input data, after deserialization, is organized into calibrated gTowers in a gTower-builder step. A seeded simple-cone jet algorithm is used for large-area non-iterative jet finding. Seeds are defined by gTowers over a configurable ET threshold. An illustration of the seeds identified in an event is shown in FIG. 18, in which a seeding step for identifying large-R jets by selecting towers over a threshold ET value is shown on the left, and summing the energy around the seeds within $\Delta R \leq 1.0$ is shown on the right of the arrow 180.

Figure 19:
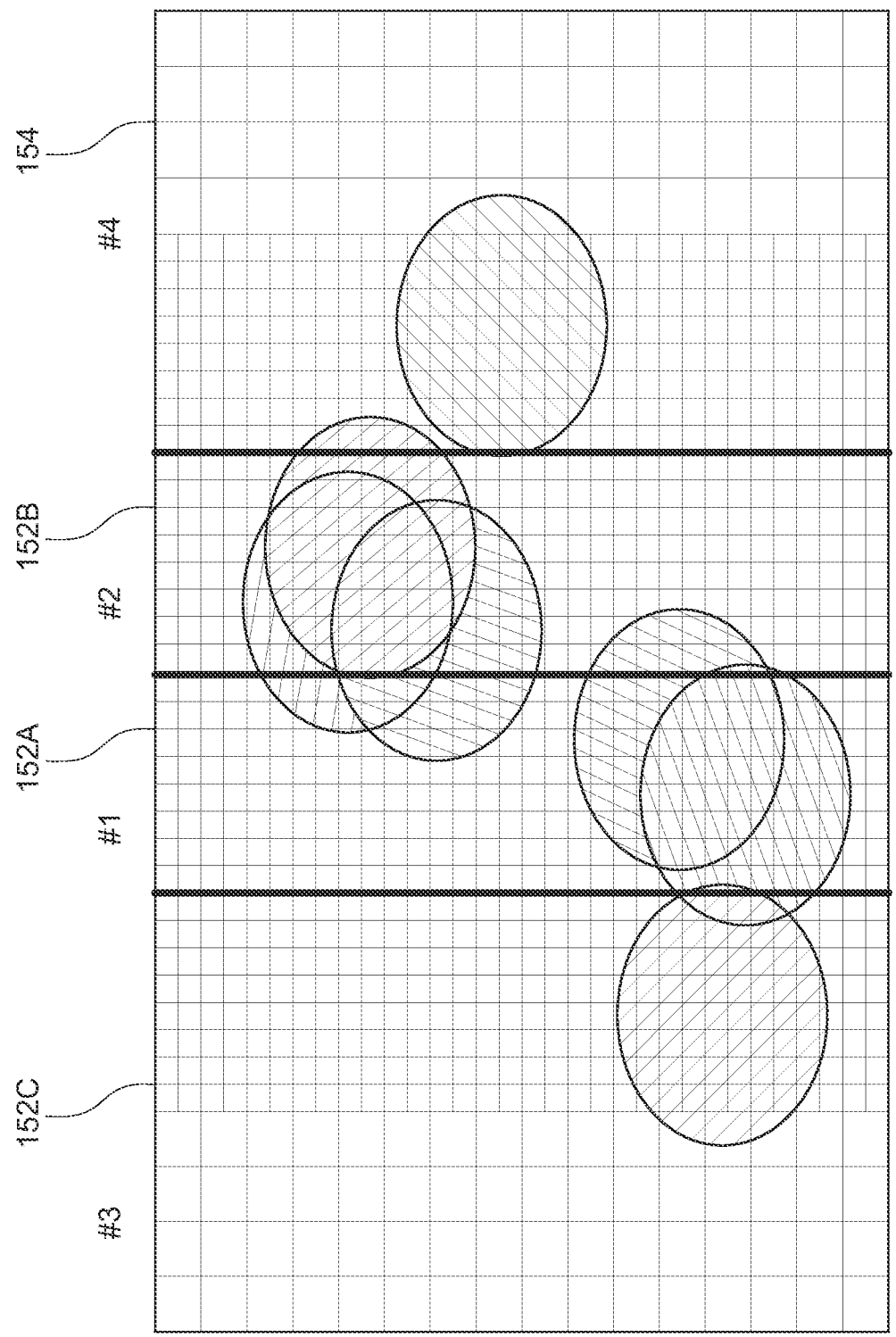
FIG. 19 shows final large-R jets computed as a result of the seeds shown in FIG. 18.

The gTower ET in a circular region surrounding the seeds is summed. Portions of the jet area may extend into an $\eta$ region on a neighboring processor FPGA. Part of the energy summation, therefore, takes place on that FPGA necessitating the transfer of seed information with low-latency parallel GPIOs. These partial sums are then sent to the original FPGA and included in the final ET of the large-R jets, as shown in FIG. 19, which shows the final large-R jets. Each jet is stored on the processor FPGA that produced the seed, which is indicated by the reference designations corresponding to that FPGA as shown in FIGS. 15, 18, 19. The jets are allowed to overlap, which enhances the efficiency for events with complex topologies, in which multiple energy depositions are close together, as is typically found in events containing boosted objects.

The architecture of the reconfigurable computing platform 150 permits event-by-event local pileup suppression for large-R objects using baseline subtraction techniques. Pileup subtraction is performed using the energy density p measured on the gTowers within each processing region and is calculated on an event-by-event basis. The baseline energy subtracted from each jet is determined by the product of the area of each jet and the energy density from the associated region. In the past, this baseline subtraction used an average value for all events but is now calculated for each event in accordance with the disclosed embodiments.

A CACTUS/IPbus interface is provided for high-level control of the reconfigurable computing platform 150, which allows algorithmic parameters to be set, modes of operation to be controlled, and spy memories to be read. The IPbus protocol is implemented in the hybrid FPGA 154 including the standard firmware modified to run on the FPGA 154 and the software suite from CACTUS for a Linux instance running on an ARM processor.

The hybrid FPGA 154 implements an intelligent platform management controller (IPMC) to monitor voltage and current of power rails on the reconfigurable computing platform. The hybrid FPGA 154 also monitors the temperature of all FPGA 152 via embedded sensors, and of any areas of dense logic via discrete sensors. This data is transmitted to an external monitoring system by the hybrid FPGA 154.

If any board temperature exceeds a programmable threshold, the IPMC powers down the board payload, which includes components not on the management power supply. The thresholds, at which this function is activated, are set above the levels at which the detector control system (DCS) powers down the module. Thus, this mechanism activates if the DCS fails, which may occur, for example, if there is a sudden or rapid rise in temperature to which the DCS cannot respond in sufficient time.

Two negative 48 V inputs are ORed and inverted to one +48 V by an ATCA board power input module (PIM 400). The +48 V power is stepped down to 12V by a DC-DC converter, and the remaining power rails, such as 1.0V, 1.2 V, 1.8 V, 2.5 V, and 3.3 V are generated from 12 V with different DC-DC power modules.

There are two types of optical transceivers (MiniPODs and MicroPODs) and two different MGTs (GTX and GTH) on the reconfigurable computing platform 150 board. Thus, each MGT is connected to two types of optical transceivers. Moreover, the GTH to GTH loopback, GTX to GTX loopback, GTH to GTX loopback, and GTX to GTH loopback are also included on the reconfigurable computing platform 150 board.

High-speed parallel GPIOs are used to transfer data between FPGA 152. The GPIOs operate at 480 Mb/s with a 50-bit width. Three different 50-bit GPIOs are used. The first is from processor FPGA high performance (HP) banks to HP banks with an LVDS differential interface, the second is from processor FPGA HP banks to ZYNQ HP banks with an LVDS differential interface, and the third is from processor FPGA HP bank to HP banks with a single-ended HSTL interface.

When the 80-channel GTHs of the processor FPGA 152 and 16-channel GTXs of the ZYNQ 154 are turned on, the links is stable at 12.8 Gb/s with no error bit detected and a bit error rate less than $10^{-15}$. The GTH provides better performance than the GTX, and the MiniPODs 14 are approximately the same as the MicroPODs The data buses are stable at 960 Mb/s. The stable range for the processor FPGA HP banks to processor FPGA HP banks LVDS and HSTL interface is approximately 0.78 ps, which is 75% of a half cycle at 480 MHz. For the processor FPGA HP banks to ZYNQ HP banks LVDS interface, the stable range is about 0.702 ps, which is 67% of a half cycle at 480 MHz.

The initial motivation for developing the reconfigurable computing platform was provided by the ATLAS experiment, which is one of seven (7) particle detector experiments constructed at the large hadron collector (LHC) apparatus (ATLAS) detector at CERN (European Organization for Nuclear Research). The experiment is designed to take advantage of the unprecedented energy available at the LHC and observe phenomena related to highly massive particles that were not observable using earlier lower-energy accelerators. ATLAS is designed to search for evidence of particle physics theories beyond the standard model.

Figure 22:
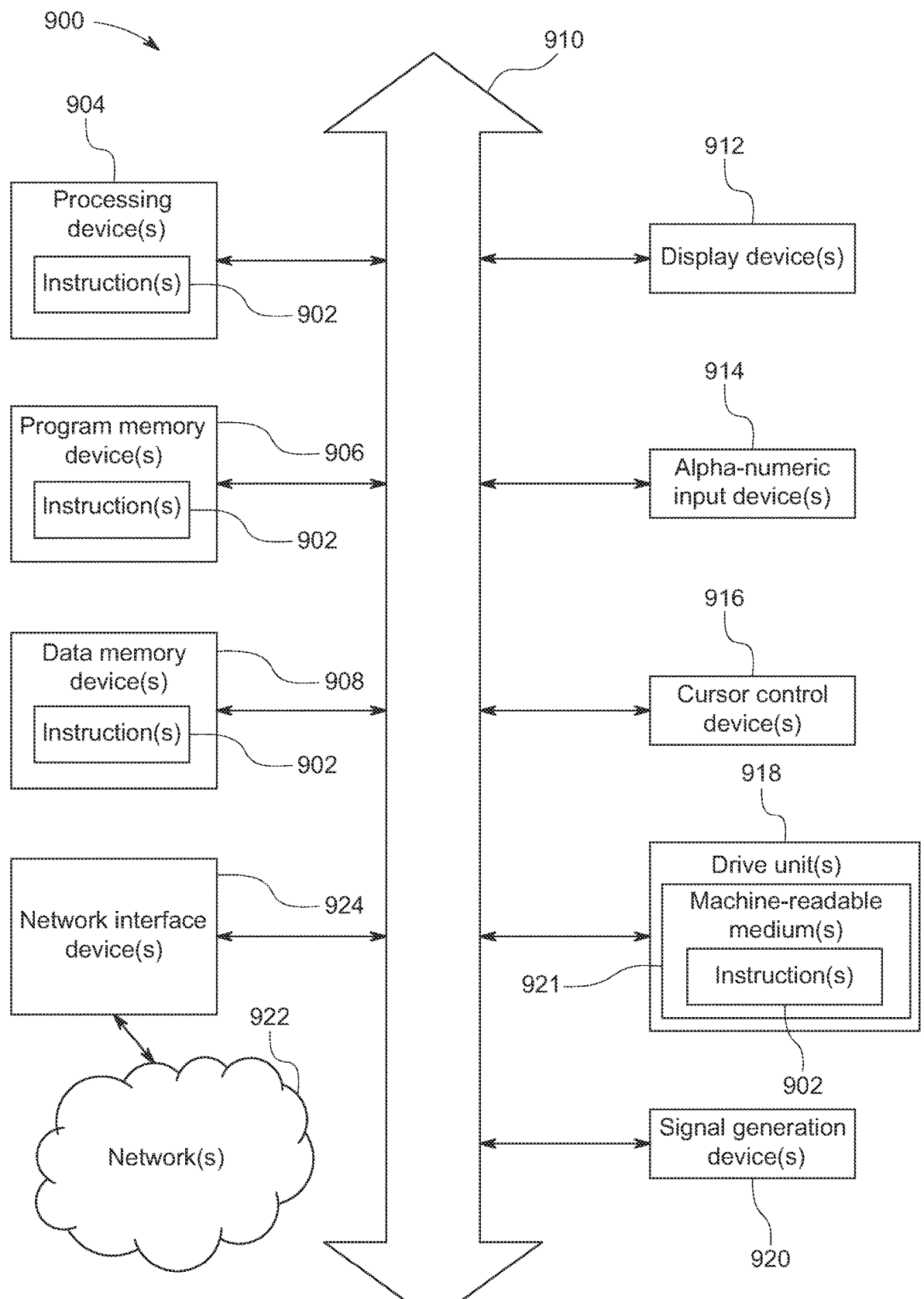
FIG. 22 shows a block diagram of at least a portion of an exemplary machine in the form of a computing system that performs methods according to one or more embodiments disclosed herein.

One or more embodiments disclosed herein, or a portion thereof, may make use of software running on a computer or workstation. By way of example, only and without limitation, FIG. 22 is a block diagram of an embodiment of a machine in the form of a computing system 900, within which is a set of instructions 902 that, when executed, cause the machine to perform any one or more of the methodologies according to embodiments of the invention. In one or more embodiments, the machine operates as a standalone device; in one or more other embodiments, the machine is connected (e.g., via a network 922) to other machines. In a networked implementation, the machine operates in the capacity of a server or a client user machine in a server-client user network environment. Exemplary implementations of the machine as contemplated by embodiments of the invention include, but are not limited to, a server computer, client user computer, personal computer (PC), tablet PC, personal digital assistant (PDA), cellular telephone, mobile device, palmtop computer, laptop computer, desktop computer, communication device, personal trusted device, web appliance, network router, switch or bridge, or any machine capable of executing a set of instructions (sequential or otherwise) that specify actions to be taken by that machine.

The computing system 900 includes a processing device(s) 904 (e.g., a central processing unit (CPU), a graphics processing unit (GPU), or both), program memory device(s) 906, and data memory device(s) 908, which communicate with each other via a bus 910. The computing system 900 further includes display device(s) 912 (e.g., liquid crystal display (LCD), flat panel, solid state display, or cathode ray tube (CRT)). The computing system 900 includes input device(s) 914 (e.g., a keyboard), cursor control device(s) 916 (e.g., a mouse), disk drive unit(s) 918, signal generation device(s) 920 (e.g., a speaker or remote control), and network interface device(s) 924, operatively coupled together, and/or with other functional blocks, via bus 910.

The disk drive unit(s) 918 includes machine-readable medium(s) 926, on which is stored one or more sets of instructions 902 (e.g., software) embodying any one or more of the methodologies or functions herein, including those methods illustrated herein. The instructions 902 may also reside, completely or at least partially, within the program memory device(s) 906, the data memory device(s) 908, and/or the processing device(s) 904 during execution thereof by the computing system 900. The program memory device(s) 906 and the processing device(s) 904 also constitute machine-readable media. Dedicated hardware implementations, such as but not limited to ASICs, programmable logic arrays, and other hardware devices can likewise be constructed to implement methods described herein. Applications that include the apparatus and systems of various embodiments broadly comprise a variety of electronic and computer systems. Some embodiments implement functions in two or more specific interconnected hardware modules or devices with related control and data signals communicated between and through the modules, or as portions of an ASIC. Thus, the example system is applicable to software, firmware, and/or hardware implementations.

The term "processing device" as used herein is intended to include any processor, such as, for example, one that includes a CPU (central processing unit) and/or other forms of processing circuitry. Further, the term "processing device" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the display device(s) 912, input device(s) 914, cursor control device(s) 916, signal generation device(s) 920, etc., can be collectively referred to as an "input/output interface," and is intended to include one or more mechanisms for inputting data to the processing device(s) 904, and one or more mechanisms for providing results associated with the processing device(s). Input/output or I/O devices (including but not limited to keyboards (e.g., alpha-numeric input device(s) 914, display device(s) 912, and the like) can be coupled to the system either directly (such as via bus 910) or through intervening input/output controllers (omitted for clarity).

In an integrated circuit implementation of one or more embodiments of the invention, multiple identical dies are typically fabricated in a repeated pattern on a surface of a semiconductor wafer. Each such die may include a device described herein and may include other structures and/or circuits. The individual dies are cut or diced from the wafer, then packaged as integrated circuits. One skilled in the art would know how to dice wafers and package die to produce integrated circuits. Any of the exemplary circuits or method illustrated in the accompanying figures, or portions thereof, may be part of an integrated circuit. Integrated circuits so manufactured are considered part of this invention.

In accordance with various embodiments, the methods, functions or logic described herein is implemented as one or more software programs running on a computer processor. Dedicated hardware implementations including, but not limited to, application specific integrated circuits, programmable logic arrays and other hardware devices can likewise be constructed to implement the methods described herein. Further, alternative software implementations including, but not limited to, distributed processing or component/object distributed processing, parallel processing, or virtual machine processing can also be constructed to implement the methods, functions or logic described herein.

The embodiment contemplates a machine-readable medium or computer-readable medium including instructions 902, or that which receives and executes instructions 902 from a propagated signal so that a device connected to a network environment 922 can send or receive voice, video or data, and to communicate over the network 922 using the instructions 902. The instructions 902 are further transmitted or received over the network 922 via the network interface device(s) 924. The machine-readable medium also contains a data structure for storing data useful in providing a functional relationship between the data and a machine or computer in an illustrative embodiment of the systems and methods herein.

While the machine-readable medium 902 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding, or carrying a set of instructions for execution by the machine and that cause the machine to perform anyone or more of the methodologies of the embodiment. The term "machine-readable medium" shall accordingly be taken to include, but not be limited to: solid-state memory (e.g., solid-state drive (SSD), flash memory, etc.); read-only memory (ROM), or other non-volatile memory; random access memory (RAM), or other re-writable (volatile) memory; magneto-optical or optical medium, such as a disk or tape; and/or a digital file attachment to e-mail or other self-contained information archive or set of archives is considered a distribution medium equivalent to a tangible storage medium. Accordingly, the embodiment is considered to include anyone or more of a tangible machine-readable medium or a tangible distribution medium, as listed herein and including art-recognized equivalents and successor media, in which the software implementations herein are stored.

It should also be noted that software, which implements the methods, functions and/or logic herein, are optionally stored on a tangible storage medium, such as: a magnetic medium, such as a disk or tape; a magneto-optical or optical medium, such as a disk; or a solid state medium, such as a memory automobile or other package that houses one or more read-only (non-volatile) memories, random access memories, or other re-writable (volatile) memories. A digital file attachment to e-mail or other self-contained information archive or set of archives is considered a distribution medium equivalent to a tangible storage medium. Accordingly, the disclosure is considered to include a tangible storage medium or distribution medium as listed herein and other equivalents and successor media, in which the software implementations herein are stored.

Although the specification describes components and functions implemented in the embodiments with reference to particular standards and protocols, the embodiments are not limited to such standards and protocols.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments are utilized and derived therefrom, such that structural and logical substitutions and changes are made without departing from the scope of this disclosure. Figures are also merely representational and are not drawn to scale. Certain proportions thereof are exaggerated, while others are decreased. Accordingly, the specification and drawings are to be regarded in an illustrative rather than a restrictive sense.

Such embodiments are referred to herein, individually and/or collectively, by the term "embodiment" merely for convenience and without intending to voluntarily limit the scope of this application to any single embodiment or inventive concept if more than one is in fact shown. Thus, although specific embodiments have been illustrated and described herein, it should be appreciated that any arrangement calculated to achieve the same purpose are substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

In the foregoing description of the embodiments, various features are grouped together in a single embodiment for the purpose of streamlining the disclosure. This method of disclosure is not to be interpreted as reflecting that the claimed embodiments have more features than are expressly recited in each claim. Rather, as the following claims reflect, inventive subject matter lies in less than all features of a single embodiment. Thus, the following claims are hereby incorporated into the detailed description, with each claim standing on its own as a separate example embodiment.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single embodiment. Thus, the following claims are hereby incorporated into the Detailed Description, with each claim standing on its own as separately claimed subject matter.

Although specific example embodiments have been described, it will be evident that various modifications and changes are made to these embodiments without departing from the broader scope of the inventive subject matter described herein. Accordingly, the specification and drawings are to be regarded in an illustrative rather than a restrictive sense. The accompanying drawings that form a part hereof, show by way of illustration, and without limitation, specific embodiments in which the subject matter are practiced. The embodiments illustrated are described in sufficient detail to enable those skilled in the art to practice the teachings herein. Other embodiments are utilized and derived therefrom, such that structural and logical substitutions and changes are made without departing from the scope of this disclosure. This Detailed Description, therefore, is not to be taken in a limiting sense, and the scope of various embodiments is defined only by the appended claims, along with the full range of equivalents to which such claims are entitled.

Given the teachings provided herein, one of ordinary skill in the art will be able to contemplate other implementations and applications of the techniques of the disclosed embodiments. Although illustrative embodiments have been described herein with reference to the accompanying drawings, it is to be understood that these embodiments are not limited to the disclosed embodiments, and that various other changes and modifications are made therein by one skilled in the art without departing from the scope of the appended claims.

What is claimed is:

1. A reconfigurable computing platform, which comprises:
   a reconfigurable computing device disposed on a multilayer board;
   an electro-optical transceiver disposed on the multilayer board, the electro-optical transceiver converting an optical signal at least one of to and from an electrical signal, the electrical signal operatively coupled to the reconfigurable computing device, the electro-optical transceiver disposed in proximity to the reconfigurable computing device; and
   a first voltage converter disposed on the multilayer board, the first voltage converter operatively coupled to a common voltage distributed around a periphery of the multilayer board, the first voltage converter converting the common voltage to a first operating voltage, the first voltage converter disposed in proximity to the reconfigurable computing device, the first operating voltage provided to the reconfigurable computing device as a first power source.

2. The reconfigurable computing platform, as defined by claim 1, wherein the first voltage converter comprises a first voltage regulator, the first voltage regulator regulating the first operating voltage.

3. The reconfigurable computing platform, as defined by claim 1, wherein the first voltage converter is disposed less than 4 inches in proximity to the reconfigurable computing device.

4. The reconfigurable computing platform, as defined by claim 1, further comprising a second voltage converter, the second voltage converter operatively coupled to the common voltage, the second voltage converter converting the common voltage to a second operating voltage, the second voltage converter disposed in proximity to the electro-optical transceiver, the second operating voltage provided to the electro-optical transceiver as a second power source.

5. The reconfigurable computing platform, as defined by claim 4, wherein the second voltage converter comprises a second voltage regulator, the second voltage regulator regulating the second operating voltage.

6. The reconfigurable computing platform, as defined by claim 4, wherein the second voltage converter is disposed less than 4 inches in proximity to the electro-optical transceiver.

7. The reconfigurable computing platform, as defined by claim 1, wherein the reconfigurable computing device comprises a field programmable gate array.

8. The reconfigurable computing platform, as defined by claim 1, wherein the optical signal at least one of originates and terminates external to the multilayer board.

9. The reconfigurable computing platform, as defined by claim 1, wherein the electrical signal originates and terminates on the multilayer board.

10. The reconfigurable computing platform, as defined by claim 1, wherein the electro-optical transceiver is disposed less than 4 inches in proximity to the reconfigurable computing device.

11. The reconfigurable computing platform, as defined by claim 1, wherein the electrical signal is operatively coupled between the electro-optical transceiver and reconfigurable computing device using a first trace associated with the multilayer board, the first trace comprising a length of less than approximately 3 inches.

12. The reconfigurable computing platform, as defined by claim 1, wherein at least one of the reconfigurable computing device and electro-optical transceiver is disposed on the multilayer board based on an above-board height associated with the at least one of the reconfigurable computing device and electro-optical transceiver such that an air flow channel is disposed above the at least one of the reconfigurable computing device and electro-optical transceiver in response to air flowing over the multilayer board, the above-board height defining a distance from a top surface of the multilayer board to a top surface of the at least one of the reconfigurable computing device and electro-optical transceiver.

13. The reconfigurable computing platform, as defined by claim 1, further comprising a decoupling capacitor, the decoupling capacitor being disposed on a rear side of the multilayer board, the decoupling capacitor being electrically coupled to at least one of the reconfigurable computing device and electro-optical transceiver using a via, the at least one of the reconfigurable computing device and electro-optical transceiver disposed on a front side of the printed circuit board, the rear side opposing the front side, a back-drilling technique applied to the via.

14. The reconfigurable computing platform, as defined by claim 13, wherein the via is electrically coupled to the decoupling capacitor and the at least one of the reconfigurable computing device and electro-optical transceiver by a second trace, the second trace comprising an impedance, the impedance being maintained using the back-drilling technique.

15. The reconfigurable computing platform, as defined by claim 1, wherein the reconfigurable computing device operates synchronously with respect to a dock signal, the reconfigurable computing device recovering the clock signal based on the optical signal, thereby enabling synchronization of the reconfigurable computing device to an electrical component disposed externally to the multilayer board.

16. A reconfigurable computing system, which comprises:
a plurality of reconfigurable computing platforms operatively coupled together using an optical signal, at least one of the plurality of reconfigurable computing platforms comprising:
a reconfigurable computing device disposed On a multilayer board;
an electro-optical transceiver disposed on the multilayer board, the electro-optical transceiver converting the optical signal to and from an electrical signal, the electrical signal operatively coupled to the reconfigurable computing device, the electro-optical transceiver disposed in proximity to the reconfigurable computing device; and
a first voltage converter disposed on the multilayer board, the first voltage converter operatively coupled to a common voltage distributed around a periphery of the multilayer board, the first voltage converter converting the common voltage to a first operating voltage, the first voltage converter disposed in proximity to the reconfigurable computing device, the first operating voltage provided to the reconfigurable computing device as a first power source.

17. The reconfigurable computing system, as defined by claim 16, wherein the first voltage converter comprises a first voltage regulator, the first voltage regulator regulating the first operating voltage, the first voltage converter disposed less than 4 inches in proximity to the reconfigurable computing device.

18. The reconfigurable computing system, as defined by claim 16, further comprising a second voltage converter, the second voltage converter operatively coupled to the common voltage, the second voltage converter converting the common voltage to a second operating voltage, the second voltage converter disposed in proximity to the electro-optical transceiver, the second operating voltage provided to the electro-optical transceiver as a second power source, the second voltage converter comprising a second voltage regulator, the second voltage regulator regulating the second operating voltage, the second voltage converter disposed less than 4 inches in proximity to the electro-optical transceiver.

19. A method of providing a reconfigurable computing platform, which comprises:
disposing a reconfigurable computing device on a multilayer board;
disposing an electro-optical transceiver in proximity to the reconfigurable computing device on the multilayer board, the electro-optical transceiver converting an optical signal to and from an electrical signal, the electrical signal operatively coupled to the reconfigurable computing device; and
disposing a first voltage converter in proximity to the reconfigurable computing device on the multilayer board, the first voltage converter operatively coupled to a common voltage distributed around a periphery of the multilayer board, the first voltage converter converting the common voltage to a first operating voltage, the first operating voltage provided to the reconfigurable computing device as a first power source.

20. The method of providing a reconfigurable computing platform, as defined by claim 19, wherein the first voltage converter comprises a first voltage regulator, the first voltage regulator regulating the first operating voltage, the method further comprising disposing the first voltage converter less than 4 inches in proximity to the reconfigurable computing device.

* * * * *